United States Patent [19]

Tang et al.

[11] Patent Number: 4,769,292

[45] Date of Patent: Sep. 6, 1988

[54] ELECTROLUMINESCENT DEVICE WITH MODIFIED THIN FILM LUMINESCENT ZONE

[75] Inventors: Ching W. Tang, Rochester; Chin H. Chen, Fairport; Ramanuj Goswami, Rochester, all of N.Y.

[73] Assignee: Eastman Kodak Company, Rochester, N.Y.

[21] Appl. No.: 108,342

[22] Filed: Oct. 14, 1987

Related U.S. Application Data

[63] Continuation-in-part of Ser. No. 020,408, Mar. 2, 1987, abandoned.

[51] Int. Cl.$^4$ .............................................. A01J 63/04
[52] U.S. Cl. .................................. 428/690; 313/504; 428/917
[58] Field of Search ...................... 428/690, 691, 917; 313/503

[56] References Cited

U.S. PATENT DOCUMENTS

| | | | |
|---|---|---|---|
| 3,172,862 | 3/1965 | Gurnee et al. | 252/301.3 |
| 3,173,050 | 3/1965 | Gurnee | 313/108 |
| 3,359,445 | 12/1967 | Roth | 313/108 |
| 3,382,394 | 5/1968 | Mehl | 313/108 |
| 3,530,325 | 9/1970 | Mehl et al. | 313/108 |
| 3,621,321 | 11/1971 | Williams et al. | 313/108 A |
| 3,710,167 | 1/1973 | Dresner et al. | 313/108 A |
| 3,772,556 | 11/1973 | Williams | 313/108 A |
| 3,995,299 | 11/1976 | Partridge | 357/8 |
| 4,356,429 | 10/1982 | Tang | 313/503 |
| 4,539,507 | 9/1985 | VanSlyke et al. | 313/504 |

OTHER PUBLICATIONS

Kawabe et al "Electroluminescence of Green Light Region in Doped Anthracene", *Japan Journal of Applied Physics*, vol. 10, pp. 527–528, 1971.

Dresner, "Double Injection Electroluminescence in Anthracene", RCA Review, vol. 30, pp. 322–334, 1969.

VanSlyke et al U.S. Ser. No. 13,528, filed Feb. 11, 1987, titled Electroluminescent Device with Organic Luminescent Medium.

Tang et al U.S. Ser. No. 13,530, filed Feb. 11, 1987, titled Electroluminescent Device with Improved Cathode.

*Primary Examiner*—Nancy A. B. Swisher
*Attorney, Agent, or Firm*—Carl O. Thomas

[57] ABSTRACT

An electroluminescent device is disclosed having a luminescent zone of less than one $\mu m$ in thickness comprised of an organic host material capable of sustaining hole-electron recombination and a fluorescent material capable of emitting light in response to energy released by hole-electron recombination.

19 Claims, 1 Drawing Sheet

ELECTROLUMINESCENT DEVICE WITH MODIFIED THIN FILM LUMINESCENT ZONE

This is a continuation-in-part of copending U.S. Ser. No. 020,408, filed Mar. 2, 1987 abandoned.

FIELD OF THE INVENTION

This invention relates to organic electroluminescent devices. More specifically, this invention relates to devices which emit light from an organic layer positioned between anode and cathode electrodes when a voltage is applied across the electrodes.

BACKGROUND OF THE INVENTION

While organic electroluminescent devices have been known for about two decades, their performance limitations have represented a barrier to many desirable applications.

Gurnee et al U.S. Pat. No. 3,172,862, issued Mar. 9, 1965, filed Sept. 29, 1960, disclosed an organic electroluminescent device. (For brevity EL, the common acronym for electroluminescent, is sometimes substituted.) The EL device was formed of an emitting layer positioned in conductive contact with a transparent electrode and a metal electrode. The emitting layer was formed of a conjugated organic host material, a conjugated organic activating agent having condensed benzene rings, and a finely divided conductive material. Naphthalene, anthracene, phenanthrene, pyrene, benzopyrene, chrysene, picene, carbazole, fluorene, biphenyl, terphenyls, quaterphenyls, triphenylene oxide, dihalobiphenyl, trans-stilbene, and 1,4-diphenylbutadiene were offered as examples of organic host materials. Anthracene, tetracene, and pentacene were named as examples of activating agents, with anthracene being disclosed to impart a green hue and pentacene to impart a red hue. Chrome and brass were disclosed as examples of the metal electrode while the transparent electrode was disclosed to be a conductive glass. The emitting layer was disclosed to be "as thin as possible, about 0.0001 inch"—i.e., 2.54 micrometers. Electroluminescence was reported at 800 volts and 2000 hertz.

Recognizing the disadvantage of employing high voltages and frequencies Gurnee U.S. Pat. No. 3,173,050 reported electroluminescence at 110 volts d.c. by employing in series with the emitting layer an impedance layer capable of accounting for 5 to 50 percent of the voltage drop across the electrodes.

Until relatively recently the art has reported at best modest performance improvements over Gurnee while resorting to increasingly challenging device constructions, such as those requiring alkali metal cathodes, inert atmospheres, relatively thick monocrystalline anthracene phosphor elements, and/or specialized device geometries. Mehl U.S. Pat. No. 3,382,394, Mehl et al U.S. Pat. No. 3,530,325, Roth U.S. Pat. No. 3,359,445, Williams et al U.S. Pat. No. 3,621,321, Williams U.S. Pat. No. 3,772,556, Kawabe et al "Electroluminescence of Green Light Region in Doped Anthracene", *Japan Journal of Applied Physics*, Vol. 10, pp. 527–528, 1971, and Partridge U.S. Pat. No. 3,995,299 are representative.

In 1969 Dresner, "Double Injection Electroluminescence in Anthracene", *RCA Review*, Vol. 30, pp. 332–334, independently corroborated the performance levels of then state of the art EL devices employing thick anthracene phosphor elements, alkali metal cathodes, and inert atmospheres to protect the alkali metal from spontaneous oxidation. These EL devices were more than 30 $\mu$m in thickness and required operating potentials of more than 300 volts. In attempting to reduce phosphor layer thickness and thereby achieve operation with potential levels below 50 volts Dresner attempted to coat anthracene powder between a conductive glass anode and a gold, platinum or tellurium grid cathode, but phosphor layer thicknesses of less than 10 $\mu$m could not be successfully achieved because of pinholes.

Dresner U.S. Pat. No. 3,710,167 reported a more promising EL device employing like Gurnee et al and Gurnee a conjugated organic compound, but as the sole component of an emitting layer of less than 10 $\mu$m (preferably 1 to 5 $\mu$m) in thickness. A tunnel injection cathode consisting of aluminum or degenerate N+ silicon with a layer of the corresponding aluminum or silicon oxide of less than 10 Angstroms in thickness was employed.

The most recent discoveries in the art of organic EL device construction have resulted from EL device constructions with two extremely thin layers (<1.0 $\mu$m in combined thickness) separating the anode and cathode, one specifically chosen to transport holes and the other specifically chosen to transport electrons and acting as the organic luminescent zone of the device. This has allowed applied voltages to be reduced for the first time into ranges approaching compatibility with integrated circuit drivers, such as field effect transistors. At the same time light outputs at these low driving voltages have been sufficient to permit observation under common ambient lighting conditions.

For example, Tang U.S. Pat. No. 4,356,429 discloses in Example 1 an EL device formed of a conductive glass transparent anode, a 1000 Angstroms hole transporting layer of copper phthalocyanine, a 1000 Angstroms electron transporting layer of tetraphenylbutadiene in poly(styrene) also acting as the luminescent zone of the device, and a silver cathode. The EL device emitted blue light when biased at 20 volts at an average current density in the range of 30 to 40 mA/cm$^2$. The brightness of the device was 5 cd/m$^2$. Tang teaches useful cathodes to be those formed from common metals with a low work function, such as indium, silver, tin, and aluminum.

A further improvement in organic layer EL devices is taught by Van Slyke et al U.S. Pat. No. 4,539,507. Referring to Example 1, onto a transparent conductive glass anode were vacuum vapor deposited successive 750 Angstrom hole transporting 1,1-bis(4-di-p-tolylaminophenyl)cyclohexane and electron transporting 4,4'-bis(5,7-di-t-pentyl-2-benzoxzolyl)stilbene layers, the latter also providing the luminescent zone of the device. Indium was employed as the cathode. The EL device emitted blue-green light (520 nm peak). The maximum brightness achieved 340 cd/m$^2$ at a current density of about 140 mA/cm$^2$ when the applied voltage was 22 volts. The maximum power conservation efficiency was about 1.4$\times$10$^{-3}$ watt/watt, and the maximum EL quantum efficiency was about 1.2$\times$10$^{-2}$ photon/electron when driven at 20 volts. Silver, tin, lead, magnesium, manganese, and aluminum are specifically mentioned for cathode construction.

Van Slyke et al U.S. Ser. No. 013,528, filed Feb. 11, 1987, commonly assigned, titled ELECTROLUMINESCENT DEVICE WITH ORGANIC LUMINESCENT MEDIUM, discloses an organic EL device comprised of, in the sequence recited, an anode, an organic hole injecting and transporting zone, an organic electron injecting and transporting zone, and a cathode. The organic EL device is further characterized in that the organic hole injecting and transporting zone is comprised of a layer in contact with the anode containing a hole injecting porphyrinic compound and a layer containing a hole transporting aromatic tertiary amine interposed between the hole injecting layer and the electron injecting and transporting zone.

Tang et al U.S. Ser. No. 013,530, filed Feb. 11, 1987, commonly assigned, titled ELECTROLUMINESCENT DEVICE WITH IMPROVED CATHODE, discloses an EL device comprised of a cathode formed of a plurality of metals other than alkali metals, at least one of which has a work function of less than 4 eV.

SUMMARY OF THE INVENTION

The discovery of techniques for fabricating organic EL devices with thin (<1 μm) luminescent zones has indicated the potential for more widespread use. Light output is directly related to current density which is in turn a function of the field gradient (volts/cm) between the electrodes. When thicker organic layers are employed, higher voltages must be employed to achieve a field gradient consistent with acceptable light output levels—e.g., light emission sufficient to be readily detected in ambient room light. With organic EL devices having thin luminescent zones acceptable luminescence can be achieved at voltage levels conveniently provided by integrated circuits.

Although thin film organic EL devices have offered promise, there have remained significant barriers to their broader use. One significant concern has been that available organic materials for forming thin luminescent zones have provided a limited choice of light emission wavelengths. For example, it can be readily appreciated that the formation of a full multicolor display requires at least a triad of individual organic EL devices, one device for emission in a different one of each of the blue, green, and red portions of the spectrum. Further, given the availability of a primary hue of emission, such as blue or green, the desirability of more precisely choosing the hue of emission arises.

In addition to the matter of the hue of light emission by the thin film organic EL devices, the stability of the devices has remained a matter of concern. Most practical applications require limited voltage input or light output variance over an extended period of time. While the aromatic tertiary amine layers employed by Van Slyke et al U.S. Pat. No. 4,539,507, cited above, have resulted in highly attractive initial light outputs in organic EL devices, the limited stability of thin film organic EL devices containing these layers has remained a deterrent to widespread use. Device degradation results in obtaining progressively lower current densities when a constant voltage is applied. Lower current densities in turn result in lower levels of light output. With a constant applied voltage, practical EL device use terminates when light emission levels drop below acceptable levels. If the applied voltage is progressively increased to hold light emission levels constant, the field across the EL device is correspondingly increased. Eventually a voltage level is required that cannot be conveniently supplied by the EL device driving circuitry or which produces a field gradient (volts/cm) exceeding the dielectric breakdown strength of the layers separating the electrodes, resulting in a catastrophic failure of the EL device.

The present invention offers to the art thin film organic EL devices having a broader range of light output wavelengths and higher stability levels than have heretofore been realized.

In one aspect this invention is directed to an electroluminescent device comprising in sequence, an anode, an organic hole injecting and transporting zone, a luminescent zone, and a cathode. The EL device is characterized in that the luminescent zone is formed by a thin film of less than 1 μm in thickness comprised of an organic host material capable of sustaining hole and electron injection and a fluorescent material capable of emitting light in response to hole-electron recombination.

The presence of the fluoresecent material permits a choice from among a wide latitude of wavelengths of light emission. By selection of the materials forming the thin film organic EL devices of this invention, including particularly any one or combination of the fluoresent materials, the cathode metals, and the hole injecting and transporting materials, more stable device operation can be achieved than has been heretofore realized.

BRIEF DESCRIPTION OF THE DRAWINGS

These and other advantages of the present invention can be better appreciated by reference to the following detailed description considered in conjunction with the drawings, in which.

The drawings are necessarily of a schematic nature, since the thicknesses of the individual layers are too thin and thickness differences of the various device elements too great to permit depiction to scale or to permit proportionate scaling.

DESCRIPTION OF PREFERRED EMBODIMENTS

Figure 1:
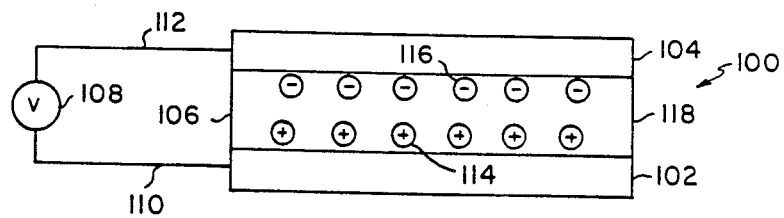
FIGS. 1, 2 and 3 are schematic diagrams of EL devices.

An electroluminescent or EL device 100 accoding to the invention is schematically illustrated in FIG. 1. Anode 102 is separated from cathode 104 by an organic luminescent medium 106. The anode and the cathode are connected to an external power source 108 by conductors 110 and 112, respectively. The power source can be a continuous direct current or alternating current voltage source or an intermittent current voltage source. Any convenient conventional power source, including any desired switching circuitry, can be employed which is capable of positively biasing the anode with respect to the cathode. Either the anode or cathode can be at ground potential.

The EL device can be viewed as a diode which is forward biased when the anode is at a higher potential than the cathode. Under these conditions the anode injects holes (positive charge carriers), schematically shown at 114, into the luminescent medium while the cathode injects electrons, schematically shown at 116, into the luminescent medium. The portion of the luminescent medium adjacent the anode thus forms a hole injecting and transporting zone while the portion of the luminescent medium adjacent the cathode forms an electron injecting and transporting zone. The injected holes and electrons each migrate toward the oppositely charged electrode. This results in hole-electron recombination within the organic luminescent medium. When a migrating electron drops from its conduction potential to a valence band in filling a hole, energy is released as light. Hence the organic luminescent medium forms between the electrodes a luminescence zone receiving mobile charge carriers from each electrode. Depending upon the choice of alternative constructions, the released light can be emitted from the luminescent material through one or more of edges 118 separating the electrodes, through the anode, through the cathode, or through any combination of the foregoing.

Reverse biasing of the electrodes reverses the direction of mobile charge migration, interrupts charge injection, and terminates light emission. The most common mode of operating organic EL devices is to employ a forward biasing d.c. power source and to rely on external current interruption or modulation to regulate light emission.

In the organic EL devices of the invention it is possible to maintain a current density compatible with efficient light emission while employing a relatively low voltage across the electrodes by limiting the total thickness of the organic luminescent medium to less than 1 $\mu$m (10,000 Angstroms). At a thickness of less than 1 $\mu$m an applied voltage of 20 volts results in a field potential of greater than $2 \times 10^5$ volts/cm, which is compatible with efficient light emission. As more specifically noted below, preferred thicknesses of the organic luminescent medium are in the range of from 0.1 to 0.5 $\mu$m (1,000 to 5,000 Angstroms), allowing further reductions in applied voltage and/or increase in the field potential, are well within device construction capabilities.

Since the organic luminescent medium is quite thin, it is usually preferred to emit light through one of the two electrodes. This is achieved by forming the electrode as a translucent or transparent coating, either on the organic luminescent medium or on a separate translucent or transparent support. The thickness of the coating is determined by balancing light transmission (or extinction) and electrical conductance (or resistance). A practical balance in forming a light transmissive metallic electrode is typically for the conductive coating to be in the thickness range of from about 50 to 250 Angstroms. Where the electrode is not intended to transmit light, any greater thickness found convenient in fabrication can also be employed.

Figure 2:
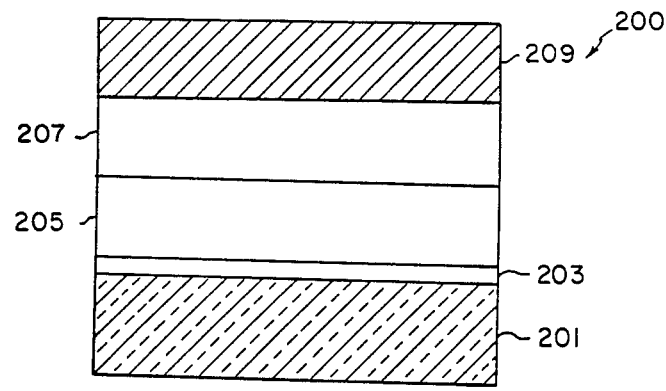

Organic EL device 200 shown in FIG. 2 is illustrative of one preferred embodiment of the invention. Because of the historical development of organic EL devices it is customary to employ a transparent anode. This has been achieved by providing a transparent insulative support 201 onto which is deposited a conductive relatively high work function metal or metal oxide transparent layer to form anode 203. Since the portion of the organic luminescent medium immediately adjacent the anode acts as a hole transporting zone, the organic luminescent medium is preferably formed by depositing on the anode a layer 205 of an organic material chosen for its hole transporting efficiency. In the orientation of the device 200 shown, the portion of the organic luminescent medium adjacent its upper surface constitutes an electron transporting zone and is formed of a layer 207 of an organic material chosen for its electron transporting efficiency. With preferred choices of materials, described below, forming the layers 205 and 207, the latter also forms the zone in which luminescence occurs. The cathode 209 is conveniently formed by deposition on the upper layer of the organic luminescent medium.

Figure 3:
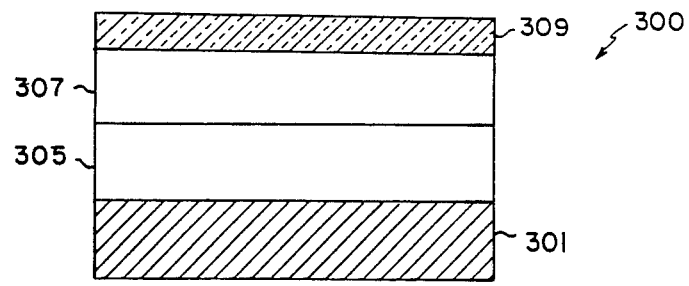

Organic EL device 300 shown in FIG. 3 is illustrative of another preferred embodiment of the invention. Contrary to the historical pattern of organic EL device development, light emission from the device 300 is through the light transmissive (e.g., transparent or substantially transparent) cathode 309. While the anode of the device 300 can be formed identically as the device 200, thereby permitting light emission through both anode and cathode, in the preferred form shown the device 300 employs an opaque charge conducting element to form the anode 301, such as a relatively high work function metallic substrate. The hole and electron transporting layers 305 and 307 can be identical to the corresponding layers 205 and 207 of the device 200 and require no further description. The significant difference between devices 200 and 300 is that the latter employs a thin, light transmissive (e.g., transparent or substantially transparent) cathode in place of the opaque cathode customarily included in organic EL devices.

Viewing organic EL devices 200 and 300 together, it is apparent that the present invention offers the option of mounting the devices on either a positive or negative polarity opaque substrate. While the organic luminescent medium of the EL devices 200 and 300 are described above as being comprised of a single organic hole injecting and transporting layer and a single electron injecting and transporting layer, further elaboration of each of these layers into multiple layers, as more specifically described below, can result in further enhancement of device performance. When multiple electron injecting and transporting layers are present, the layer receiving holes is the layer in which hole-electron recombination occurs and therefore forming the luminescent zone of the device.

In the practice of the present invention the luminescent zone is in every instance formed by a thin film (herein employed to mean less than 1 $\mu$m in thickness) comprised of an organic host material capable of sustaining hole and electron injection and a fluorescent material capable of emitting light in response to hole-electron recombination. It is preferred that the luminescent zone be maintained in a thickness range of from 50 to 5000 Angstroms and, optimally, 100 to 1000 Angstroms, so that the entire organic luminescent medium can be less than 1 $\mu$m and preferably less than 1000 Angstroms in thickness.

The host material can be conveniently formed of any material heretofore employed as the active components of a thin film luminescent zone of an organic EL device. Among host materials suitable for use in forming thin films are diarylbutadienes and stilbenes, such as those disclosed by Tang U.S. Pat. No. 4,356,429, cited above.

Still other thin film forming host materials which can be employed are optical brighteners, particularly those disclosed by Van Slyke et al U.S. Pat. No. 4,539,507, cited above and here incorporated by reference. Useful optical brighteners include those satisfying structural formulae (I) and (II):

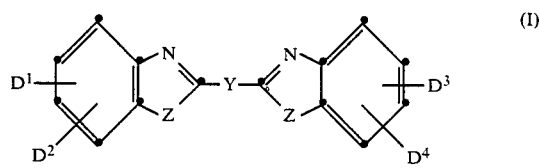

-continued
or

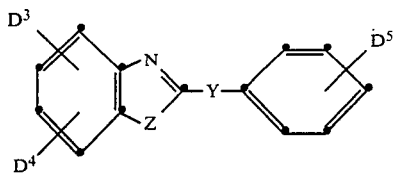

wherein
$D^1$, $D^2$, $D^3$, and $D^4$ are individually hydrogen; saturated aliphatic of from 1 to 10 carbon atoms, for example, propyl, t-butyl, heptyl, and the like; aryl of from 6 to 10 carbon atoms, for example, phenyl and naphthyl; or halo such as chloro, fluoro, and the like; or $D^1$ and $D^2$ or $D^3$ and $D^4$ taken together comprise the atoms necessary to complete a fused aromatic ring optionally bearing at least one saturated aliphatic of from 1 to 10 carbon atoms, such as methyl, ethyl, propyl and the like;

$D^5$ is a saturated aliphatic of from 1 to 20 carbon atoms, such as methyl, ethyl, n-eicosyl, and the like; aryl of from 6 to 10 carbon atoms, for example, phenyl and naphthyl; carboxyl; hydrogen; cyano; or halo, for example, chloro, fluoro and the like; provided that in formula (II) at least two of $D^3$, $D^4$ and $D^5$ are saturated aliphatic of from 3 to 10 carbon atoms, e.g., propyl, butyl, heptyl and the like;

Z is —O—, —N($D^6$)—, or —S—; and
Y is

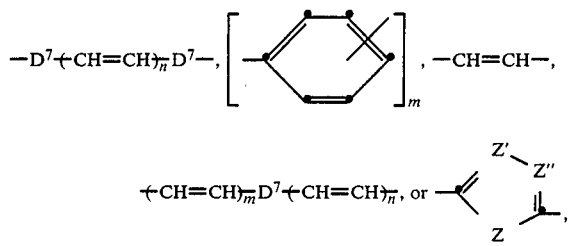

wherein
m is an integer of from 0 to 4;
n is arylene of from 6 to 10 carbon atoms, for example, phenylene and naphthylene; and
$D^6$ is hydrogen; a saturated aliphatic substituent of from 1 to 10 carbon atoms, such as an alkyl substituent; aryl of from 6 to 10 carbon atoms, such as phenyl or naphthyl; or a halo substituent, such as chloro or fluoro;
$D^7$ is arylene of from 6 to 10 carbon atoms, such as phenyl or naphthyl;
Z' and Z" are individually N or CH.

As used herein "aliphatic" includes substituted aliphatic as well as unsubstituted aliphatic. The substituents in the case of substituted aliphatic include alkyl of from 1 to 5 carbon atoms, for example, methyl, ethyl, propyl and the like; aryl of from 6 to 10 carbon atoms, for example, phenyl and naphthyl; halo, such as chloro, fluoro and the like; nitro; and alkoxy having 1 to 5 carbon atoms, for example, methoxy, ethoxy, propoxy, and the like.

Still other optical brighteners that are contemplated to be useful are listed in Vol. 5 of *Chemistry of Synthetic Dyes,* 1971, pages 618–637 and 640. Those that are not already thin-film-forming can be rendered so by attaching an aliphatic moiety to one or both end rings.

Particularly preferred host materials for forming the luminescent zone of the organic EL devices of this inventions are metal chelated oxinoid compounds, including chelates of oxine (also commonly referred to as 8-quinolinol or 8-hydroxyquinoline). Such compounds exhibit both high levels of performance and are readily fabricated in the form of thin films. Exemplary of contemplated oxinoid compounds are those satisfying structural formula (III):

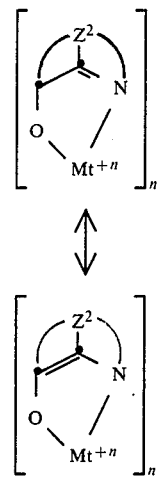

wherein
Mt represents a metal;
n is an integer of from 1 to 3; and
$Z^2$ independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

$Z^2$ completes a heterocyclic nucleus containing at least two fused aromatic rings, at one of which is an azole or azine ring. Additional rings, including both aliphatic and aromatic rings, can be fused with the two required rings, if required. To avoid adding molecular bulk without improving on function the number of ring atoms is preferably maintained at 18 or less.

Illustrative of useful host materials capable of being used to form thin films are the following:

HM-1 Aluminum trisoxine [a.k.a., tris(8-quinolinol)aluminum]
HM-2 Magnesium bisoxine [a.k.a., bis(8-quinolinol)magnesium]
HM-3 Bis[benzo{f}-8-quinolinol]zinc
HM-4 Bis(2-methyl-8-quinolinolato)aluminum oxide
HM-5 Indium trisoxine [a.k.a., tris(8-quinolinol)indium]
HM-6 Aluminum tris(5-methyloxine) [a.k.a., tris(5-methyl-8-quinolinol)aluminum]
HM-7 Lithium oxine [a.k.a., 8-quinolinol lithium]
HM-8 Gallium trisoxine [a.k.a, tris(5-chloro-8-quinolinol)gallium]
HM-9 Calcium bis(5-chlorooxine) [a.k.a, bis(5-chloro-8-quinolinol)calcium]

HM-10 Poly[zinc(II)-bis(8-hydroxy-5-quinolin-yl)methane]
HM-11 Dilithium epindolidione
HM-12 1,4-Diphenylbutadiene
HM-13 1,1,4,4-Tetraphenylbutadiene
HM-14 4,4′-Bis[5,7-di(t-pentyl-2-benzoxazolyl]stilbene
HM-15 2,5-Bis[5,7-di(t-pentyl-2-benzoxazolyl]thiophene
HM-16 2,2′-(1,4-phenylenedivinylene)bisbenzothiazole
HM-17 4,4′-(2,2′-Bisthiazolyl)biphenyl
HM-18 2,5-Bis[5-($\alpha,\alpha$-dimethylbenzyl)-2-benzoxazolyl]thiophene
HM-19 2,5-Bis[5,7-di(t-pentyl)-2-benzoxazolyl]-3,4-diphenylthiophene
HM-20 Trans-stilbene All of the host materials listed above are known to emit light in response to hole and electron injection. By blending with the host material a minor amount of a fluorescent material capable of emitting light in response to hole-electron recombination the hue light emitted from the luminescent zone can be modified. In theory, if a host material and a fluorescent material could be found for blending which have exactly the same affinity for hole-electron recombination each material should emit light upon injection of holes and electrons in the luminescent zone. The perceived hue of light emission would be the visual integration of both emissions.

Since imposing such a balance of host and fluorescent materials is highly limiting, it is preferred to choose the fluorescent material so that it provides the favored sites for light emission. When only a small proportion of fluorescent material providing favored sites for light emission is present, peak intensity wavelength emissions typical of the host material can be entirely eliminated in favor of a new peak intensity wavelength emission attributable to the fluorescent material. While the minimum proportion of fluorescent material sufficient to achieve this effect varies by the specific choice of host and fluorescent materials, in no instance is it necessary to employ more than about 10 mole percent fluorescent material, based on moles of host material and seldom is it necessary to employ more than 1 mole percent of the fluorescent material. On the other hand, for any host material capable of emitting light in the absence of fluorescent material, limiting the fluorescent material present to extremely small amounts, typically less than about $10^{-3}$ mole percent, based on host material, can result in retaining emission at wavelengths characteristic of the host material. Thus, by choosing the proportion of a fluorescent material capable of providing favored sites for light emission, either a full or partial shifting of emission wavelengths can be realized. This allows the spectral emissions of the EL devices of this invention to be selected and balanced to suit the application to be served.

Choosing fluorescent materials capable of providing favored sites for light emission necessarily involves relating the properties of the fluorescent material to those of the host material. The host material can be viewed as a collector for injected holes and electrons with the fluorescent material providing the molecular sites for light emission. One important relationship for choosing a fluorescent material capable of modifying the hue of light emission when present in a host material is a comparison of the reduction potentials of the two materials. The fluorescent materials demonstrated to shift the wavelength of light emission have exhibited a less negative reduction potential than that of the host material. Reduction potentials, measured in electron volts, have been widely reported in the literature along with varied techniques for their measurement. Since it is a comparison of reduction potentials rather than their absolute values which is desired, it is apparent that any accepted technique for reduction potential measurement can be employed, provided both the fluorescent and host material reduction potentials are similarly measured. A preferred oxidation and reduction potential measurement techniques is reported by R. J. Cox, *Photographic Sensitivity*, Academic Press, 1973, Chapter 15.

A second important relationship for choosing a fluorescent material capable of modifying the hue of light emission when present in a host material is a comparison of the bandgap potentials of the two materials. The fluorescent materials demonstrated to shift the wavelength of light emission have exhibited a lower bandgap potential than that of the host material. The bandgap potential of a molecule is taken as the potential difference in electron volts (eV) separating its ground state and first singlet state. Bandgap potentials and techniques for their measurement have been widely reported in the literature. The bandgap potentials herein reported are those measured in electron volts (eV) at an absorption wavelength which is bathochromic to the absorption peak and of a magnitude one tenth that of the magnitude of the absorption peak. Since it is a comparison of bandgap potentials rather than their absolute values which is desired, it is apparent that any accepted technique for bandgap measurement can be employed, provided both the fluorescent and host material band gaps are similarly measured. One illustrative measurement technique is disclosed by F. Gutman and L. E. Lyons, *Organic Semiconductors*, Wiley, 1967, Chapter 5.

Where a host material is chosen which is itself capable of emitting light in the absence of the fluorescent material, it has been observed that suppression of light emission at the wavelengths of emission characteristics of the host material alone and enhancement of emission at wavelengths characteristic of the fluorescent material occurs when spectral coupling of the host and fluorescent materials is achieved. By spectral coupling it is meant that an overlap exists between the wavelengths of emission characteristic of the host material alone and the wavelengths of light absorption of the fluorescent material in the absence of the host material. Optimal spectral coupling occurs when the maximum emission of the host material alone substantially matches within $\pm 25$ nm the maximum absorption of the fluorescent material alone. In practice advantageous spectral coupling can occur with peak emission and absorption wavelengths differing by up to 100 nm or more, depending on the width of the peaks and their hypsochromic and bathochromic slopes. Where less than optimum spectral coupling between the host and fluorescent materials is contemplated, a bathochromic as compared to a hypsochromic displacement of the fluorescent material produces more efficient results.

Although the foregoing discussion has been undertaken by reference to host materials which are known to themselves emit light in response to hole and electron injection, in fact light emission by the host material itself can entirely cease where light emission by the fluorescent material is favored by any one or combination of the various relationships noted above. It is appreciated that shifting the role of light emission to the fluorescent material allows a still broader range of choices of host materials. For example, one fundamental requirement of a material chosen to emit light is that it must exhibit a low extinction coefficient for light of the wavelength it emits to avoid internal absorption. The present invention permits use of host materials which are capable of sustaining the injection of holes and electrons, but are themselves incapable of efficiently emitting light.

Useful fluorescent materials are those capable of being blended with the host material and fabricated into thin films satisfying the thickness ranges described above forming the luminescent zones of the EL devices of this invention. While crystalline host materials do not lend themselves to thin film formation, the limited amounts of fluorescent materials present in the host materials permits the use of fluorescent materials which are alone incapable of thin film formation. Preferred fluorescent materials are those which form a common phase with the host material. Fluorescent dyes constitute a preferred class of fluorescent materials, since dyes lend themselves to molecular level distribution in the host material. Although any convenient technique for dispersing the fluorescent dyes in the host materials can be undertaken, preferred fluorescent dyes are those which can be vacuum vapor deposited along with the host materials. Assuming other criteria, noted above, are satisfied, fluorescent laser dyes are recognized to be particularly useful fluorescent materials for use in the organic EL devices of this invention.

One preferred class of fluorescent dyes are fluorescent coumarin dyes. Among specifically preferred fluorescent coumarin dyes are those satisfying formula IV:

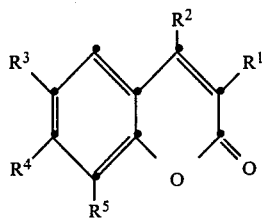

where
$R^1$ is chosen from the group consisting of hydrogen, carboxy, alkanoyl, alkoxycarbonyl, cyano, aryl, and a heterocylic aromatic group,
$R^2$ is chosen from the group consisting of hydrogen, alkyl, haloalkyl, carboxy, alkanoyl, and alkoxycarbonyl,
$R^3$ is chosen from the group consisting of hydrogen and alkyl,
$R^4$ is an amino group, and
$R^5$ is hydrogen, or
$R^1$ or $R^2$ together form a fused carbocyclic ring, and/or the amino group forming $R^4$ completes with at least one of $R^4$ and $R^6$ a fused ring.

The alkyl moieties in each instance contain from 1 to 5 carbon atoms, preferably 1 to 3 carbon atoms. The aryl moieties are preferably phenyl groups. The fused carbocyclic rings are preferably five, six or seven membered rings. The heterocyclic aromatic groups contain 5 or 6 membered heterocyclic rings containing carbon atoms and one or two heteroatoms chosen from the group consisting of oxygen, sulfur, and nitrogen. The amino group can be a primary, secondary, or tertiary amino group. When the amino nitrogen completes a fused ring with an adjacent substituent, the ring is preferably a five or six membered ring. For example, $R^4$ can take the form of a pyran ring when the nitrogen atom forms a single ring with one adjacent substituent ($R^3$ or $R^5$) or a julolidine ring (including the fused benzo ring of the coumarin) when the nitrogen atom forms rings with both adjacent substituents $R^3$ and $R^5$.

The following are illustrative fluorescent coumarin dyes known to be useful as laser dyes:
FD-1 7-Diethylamino-4-methylcoumarin
FD-2 4,6-Dimethyl-7-ethylaminocoumarin
FD-3 4-Methylumbelliferone
FD-4 3-(2'-Benzothiazolyl)-7-diethylaminocoumarin
FD-5 3-(2'-Benzimidazolyl)-7-N,N-diethylaminocoumarin
FD-6 7-Amino-3-phenylcoumarin
FD-7 3-(2'-N-Methylbenzimidazolyl)-7-N,Ndiethylaminocoumarin
FD-8 7-Diethylamino-4-trifluoromethylcoumarin
FD-9 2,3,5,6-1H,4H-Tetrahydro-8-methyl-quinolazino[9,9a,1-gh]coumarin
FD-10 Cyclopenta[c]julolindino[9,10-3]-11H-pyran-11-one
FD-11 7-Amino-4-methylcoumarin
FD-12 7-Dimethylaminocyclopenta[c]coumarin
FD-13 7-Amino-4-trifluoromethylcoumarin
FD-14 7-Dimethylamino-4-trifluoromethylcoumarin
FD-15 1,2,4,5,3H,6H,10H-Tetrahydro-8-trifluoromethyl[1]benzopyrano[9,9a,1-gh]quinolizin-10-one
FD-16 4-Methyl-7-(sulfomethylamino)coumarin sodium salt
FD-17 7-Ethylamino-6-methyl-4-trifluoromethylcoumarin
FD-18 7-Dimethylamino-4-methylcoumarin
FD-19 1,2,4,5,3H,6H,10H-Tetrahydro-carbethoxy[1-]benzopyrano[9,9a,1-gh]quinolizino-10-one
FD-20 9-Acetyl-1,2,4,5,3H,6H,10H-tetrahydro[1]benzopyrano[9,9a,1-gh]quinolizino-10-one
FD-21 9-Cyano-1,2,4,5,3H,6H,10H-tetrahydro[1]benzopyrano[9,9a,1-gh]quinolizino-10-one
FD22 9-(t-Butoxycarbonyl)-1,2,4,5,3H,6H,10H-tetrahyro[1]benzopyrano[9,9a,1-gh]quinolizino-10-one
FD-23 4-Methylpiperidino[3,2-g]coumarin
FD-24 4-Trifluoromethylpiperidino[3,2-g]coumarin
FD-25 9-Carboxy-1,2,4,5,3H,6H,10H-tetrahydro[1]benzopyrano[9,9a,1-gh]quinolizino-10-one
FD-26 N-Ethyl-4-trifluoromethylpiperidino[3,2-g]coumarin Another preferred class of fluorescent dyes are fluorescent 4-dicyanomethylene-4H-pyrans and 4-dicyanomethylene-4H-thiopyrans, hereinafter referred to as fluorescent dicyanomethylenepyran and thiopyran dyes. Preferred fluorescent dyes of this class are those satisfying formula (V):

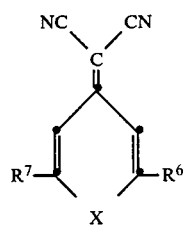

wherein
$X_6$ represents oxygen or sulfur;
$R_7$ represents a 2-(4-aminostyryl) group; and R represents a second $R^6$ group, an alkyl group, or an aryl group.

Although X most conveniently represents oxygen or sulfur, it is appreciated that higher atomic number chalcogens should provide similar, though bathochromically shifted, response. The amino group can be a primary, secondary, or tertiary amino group. In one specifically preferred form the amino group can form at least one additional fused ring with the styryl phenyl ring. For example, the styryl phenyl ring and the amino group can together form a julolidine ring or the amino group can form an five or six membered ring fused with the styryl phenyl ring. The alkyl group forming $R^7$ typically contains from 1 to 5 carbon atoms, preferably 1 to 3 carbon atoms. The aryl group forming $R^7$ is preferably phenyl. When both $R^6$ and $R^7$ form a 2-(4-aminostyryl) group, the groups can be the same or different, but symmetrical compounds are more conveniently synthesized.

The following are illustrative fluorescent dicyanomethylenepyran and thiopyran dyes:

FD-27  4-(Dicyanomethylene)-2-methyl-6-(p-dimethylaminostyryl)-4H-pyran
FD-28  4-(Dicyanomethylene)-2-methyl-6-[2-(9-julolidyl)ethenyl]-4H-pyran
FD-29  4-(Dicyanomethylene)-2-phenyl-6-[2-(9-julolidyl)ethenyl]-4H-pyran
FD-30  4-(Dicyanomethylene)-2,6-[2-(9-julolidyl)ethenyl]-4H-pyran
FD-31  4-(Dicyanomethylene)-2-methyl-6-[2-(9-julolidyl)ethenyl]-4H-thiopyran Useful fluorescent dyes can also be selected from among known polymethine dyes, which include the cyanines, merocyanines, complex cyanines and merocyanines (i.e., tri-, tetra- and poly-nuclear cyanines and merocyanines), oxonols, hemioxonols, styryls, merostyryls, and streptocyanines.

The cyanine dyes include, joined by a methine linkage, two basic heterocyclic nuclei, such as azolium or azinium nuclei, for example, those derived from pyridinium, quinolinium, isoquinolinium, oxazolium, thiazolium, selenazolium, indazolium, pyrazolium, pyrrolium, indolium, 3H-indolium, imidazolium, oxadiazolium, thiadioxazolium, benzoxazolium, benzothiazolium, benzoselenazolium, benzotellurazolium, benzimidazolium, 3H- or 1H-benzoindolium, naphthoxazolium, naphthothiazolium, naphthoselenazolium, naphthotellurazolium, carbazolium, pyrrolopyridinium, phenanthrothiazolium, and acenaphthothiazolium quaternary salts.

Exemplary of the basic heterocyclic nuclei are those satisfying Formulae VI and VII.

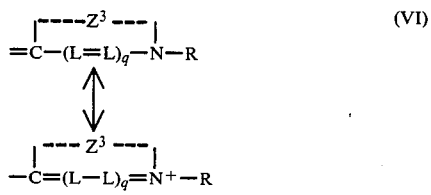
(VI)

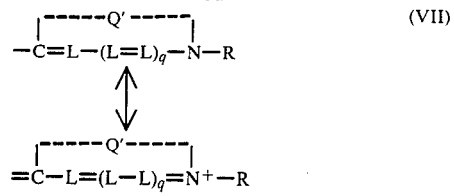
(VII)

where
$Z^3$ represents the elements needed to complete a cyclic nucleus derived from basic heterocyclic nitrogen compounds such as oxazoline, oxazole, benzoxazole, the naphthoxazoles (e.g., naphth[2,1-d]oxazole, naphth[2,3-d]oxazole, and naphth[1,2-d]oxazole), oxadiazole, thiazoline, thiazole, benzothiazole, the naphthothiazoles (e.g., naphtho[2,1-d]thiazole), the thiazoloquinolines (e.g., thiazolo[4,5-b]quinoline), phenanthrothiazole, acenaphthothiazole, thiadioxazole, selenazoline, selenazole, benzoselenazole, the naphthoselenazoles (e.g., naphtho[1,2-d]selenazole), benzotellurazole, naphthotellurazoles (e.g., naphtho[1,2-d]tellurazole), imidazoline, imidazole, benzimidazole, the naphthimidazoles (e.g., naphth[2,3-d]imidazole), 2- or 4-pyridine, 2- or 4-quinoline, 1- or 3-isoquinoline, benzoquinoline, 3H-indole, 1H- or 3H-benzoindole, and pyrazole, which nuclei may be substituted on the ring by one or more of a wide variety of substituents such as hydroxy, the halogens (e.g., fluoro, chloro, bromo, and iodo), alkyl groups or substituted alkyl groups (e.g., methyl, ethyl, propyl, isopropyl, butyl, octyl, dodecyl, octadecyl, 2-hydroxyethyl, 3-sulfopropyl, carboxymethyl, 2-cyanoethyl, and trifluoromethyl), aryl groups or substituted aryl groups (e.g., phenyl, 1-naphthyl, 2-naphthyl, 4-sulfophenyl, 3-carboxyphenyl, and 4-biphenylyl), aralkyl groups (e.g., benzyl and phenethyl), alkoxy groups (e.g., methoxy, ethoxy, and isopropoxy), aryloxy groups (e.g., phenoxy and 1-naphthoxy), alkylthio groups (e.g., methylthio and ethylthio), arylthio groups (e.g., phenylthio, p-tolylthio, and 2-naphthylthio), methylenedioxy, cyano, 2-thienyl, styryl, amino or substituted amino groups (e.g., anilino, dimethylamino, diethylamino, and morpholino), acyl groups, (e.g., formyl, acetyl, benzoyl, and benzenesulfonyl);

$Q'$ represents the elements needed to complete a cyclic nucleus derived from basic heterocyclic nitrogen compounds such as pyrrole, indole, carbazole, benzindole, pyrazole, indazole, and pyrrolopyridine;

R represents alkyl groups, aryl groups, alkenyl groups, or aralkyl groups, with or without substituents, (e.g., carboxy, hydroxy, sulfo, alkoxy, sulfato, thiosulfato, phosphono, chloro, and bromo substituents);

L is in each occurrence independently selected to represent a substituted or unsubstituted methine group—e.g., $-CR^3=$ groups, where $R^8$ represents hydrogen when the methine group is unsubstituted and most commonly represents alkyl of from 1 to 4 carbon atoms or phenyl when the methine group is substituted; and q is 0 or 1.

Cyanine dyes can contain two heterocyclic nuclei of the type shown in Formula VI joined by a methine linkage containing an uneven number of methine groups or can contain a heterocyclic nucleus according to each of Formulae VI and VII joined by a methine linkage containing an even number of methine groups, where the methine groups can take the form —CR$^8$=as described above. The greater the number of the methine groups linking nuclei in the polymethine dyes in general and the cyanine dyes in particular the longer the absorption wavelengths of the dyes. For example, dicarbocyanine dyes (cyanine dyes containing five methine groups linking two basic heterocyclic nuclei) exhibit longer absorption wavelengths than carbocyanine dyes (cyanine dyes containing three methine groups linking two basic heterocyclic nuclei) which in turn exhibit longer absorption wavelengths than simple cyanine dyes (cyanine dyes containing a single methine group linking two basic heterocyclic nuclei). Carbocyanine and dicarbocyanine dyes are longer wavelength dyes while simple cyanine dyes are typically yellow dyes, but can exhibit absorption maxima up to about 550 nm in wavelength with proper choice of nuclei and other components capable of bathochromically shifting absorption.

Preferred polymethine dyes, particularly cyanine dyes, for use as fluorescent dyes are so-called rigidized dyes. These dyes are constructed to restrict the movement of one nucleus in relation to another. This avoids radiationless, kinetic dissipation of the excited state energy. One approach to rigidizing the dye structure is to incorporate a separate bridging group providing a separate linkage in addition to the methine chain linkage joining the terminal nuclei of the dye. Bridged polymethine dyes are illustrated by Brooker et al U.S. Pat. No. 2,478,367, Brooker U.S. Pat. No. 2,479,152, Gilbert U.S. Pat. No. 4,490,463, and Tredwell et al, "Picosecond Time Resolved Fluorescence Lifetimes of the Polymethine and Related Dyes", *Chemical Physics*, Vol. 43 (1979) pp. 307–316.

The methine chain joining polymethine dye nuclei can be rigidized by including the methine chain as part of a cyclic nucleus joining the terminal basic nuclei of the dye. One of the techniques for both rigidizing and bathochromically shifting the absorption maxima of polymethine dyes in general and cyanine dyes in particular is to include in the methine linkage an oxocarbon bridging nucleus. Exemplary oxocarbon bridging nuclei can take any of the forms indicated by Formula VIII.

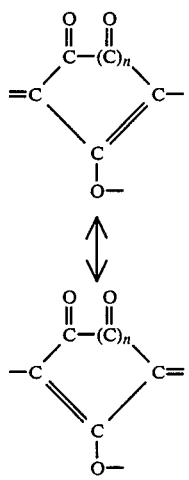
(VIII)

wherein n is the integer 0, 1, or 2.

Merocyanine dyes link one of the cyanine dye type basic heterocyclic nuclei described above to an acidic keto methylene nucleus through a methine linkage as described above, but containing zero, two, or a higher even number of methine groups. Zero methine dyes, those containing no methine groups in the linkage between nuclei, exhibit a double bond linkage between the nuclei in one resonance form and a single bound linkage in another resonance form. In either resonance form the linkage sites in the nuclei are formed by methine groups forming a part of each nucleus. Zero methine polymethine dyes are yellow dyes.

Exemplary acidic nuclei are those which satisfy Formula IX.

(IX)

where
G$^1$ represents an alkyl group or substituted alkyl group, an aryl or substituted aryl group, an aralkyl group, an alkoxy group, an aryloxy group, a hydroxy group, an amino group, or a substituted amino group, wherein exemplary substituents can take the various forms noted in connection with Formulae VI and VII;
G$^2$ can represent any one of the groups listed for G$^1$ and in addition can represent a cyano group, an alkyl, or arylsulfonyl group, or a group represented by

or G$^2$ taken together with G$^1$ can represent the elements needed to complete a cyclic acidic nucleus such as those derived from 2,4-oxazolidinone (e.g., 3-ethyl-2,4-oxazolidindione), 2,4-thiazolidindione (e.g., 3-methyl-2,4-thiazolidindione), 2-thio-2,4-oxazolidindione (e.g., 3-phenyl-2-thio-2,4-oxazolidindione), rhodanine, such as 3-ethylrhodanine, 3-phenylrhodanine, 3-(3-dimethylaminopropyl)-rhodanine, and 3-carboxymethylrhodanine, hydantoin (e.g., 1,3-diethylhydantoin and 3-ethyl-1-phenylhydantoin), 2-thiohydantoin (e.g., 1-ethyl-3-phenyl-2-thiohydantoin, 3-heptyl-1-phenyl-2-thiohydantoin, and arylsulfonyl-2-thiohydantoin), 2-pyrazolin-5-one, such as 3-methyl-1-phenyl-2-pyrazolin-5-one, 3-methyl-1-(4-carboxybutyl)-2-pyrazolin-5-one, and 3-methyl-2-(4-sulfophenyl)-2-pyrazolin-5-one, 2-isoxazolin-5-one (e.g., 3-phenyl-2-isoxazolin-5-one), 3,5-pyrazolidindione (e.g., 1,2-diethyl-3,5-pyrazolidindione and 1,2-diphenyl-3,5-pyrazolidindione), 1,3-indandione, 1,3-dioxane-4,6-dione, 1,3-cyclohexanedione, barbituric acid (e.g., 1-ethylbarbituric acid and 1,3-diethylbarbituric acid), and 2-thiobarbituric acid (e.g., 1,3-diethyl-2-thiobarbituric acid and 1,3-bis(2-methoxyethyl)-2-thiobarbituric acid).

Useful hemicyanine dyes are essentially similar to the merocyanine dyes described above, differing only in substituting for the keto methylene group of Formula IX the group shown below in Formula X.

(X)

where $G^3$ and $G^4$ may be the same or different and may represent alkyl, substituted alkyl, aryl, substituted aryl, or aralkyl, as illustrated for ring substituents in Formula VI or $G^3$ and $G^4$ taken together complete a ring system derived from a cyclic secondary amine, such as pyrrolidine, 3-pyrroline, piperidine, piperazine (e.g., 4-methylpiperazine and 4-phenylpiperazine), morpholine, 1,2,3,4-tetrahydroquinoline, decahydroquinoline, 3-azabicyclo[3,2,2]nonane, indoline, azetidine, and hexahydroazepine.

Useful hemioxonol dyes exhibit a keto methylene nucleus as shown in Formula IX and a nucleus as shown in Formula X joined by a methine linkage as previously described containing one or a higher uneven number of methine groups.

Useful merostyryl dyes exhibit a keto methylene nucleus as shown in Formula IX and a nucleus as shown in Formula XI joined by a methine linkage as described above containing one or a higher uneven number of methine groups.

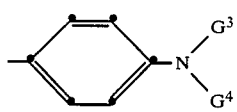

(XI)

where $G^3$ and $G^4$ are as previously defined.

The longer wavelength cyanine, merocyanine, hemicyanine, hemioxonol, and merostyryl dyes described above are intended to be illustrative of the simpler structural forms of useful longer wavelength polymethine dyes. It is generally recognized that substituents can join the nuclei and methine linkages to form additional cyclic structures. Further, the dyes can contain three or more nuclei. For example, by substituting a merocyanine dye in methine linkage with a second basic heterocyclic nucleus of the cyanine dye type an allopolar cyanine dye can be formed. Further, the various substituents not forming a part of the dye chromophore can be varied as desired to tailor dye physical properties, particularly hydrophobicity and hydrophillicity, to suit the particular film forming components employed. By choosing as the aliphatic moieties of the dyes hydrocarbon groups having more carbon atoms (e.g., from about 6 to 20 carbon atoms) the dyes can be rendered more oleophilic while hydrocarbon groups containing fewer numbers of carbon atoms (e.g., 1 to 5 carbon atoms) and particularly those bearing polar substituents render the dyes more hydrophilic. The aromatic moieties of the dyes typically contain from 6 to 10 carbon atoms.

The following are illustrative of polymethine dyes capable of maximum light absorption at shorter (<550 nm) wavelengths:

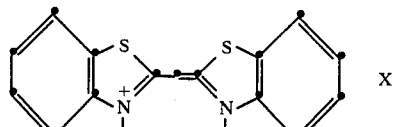

| | R | X⁻ |
|---|---|---|
| FD-32 | —C₁₆H₃₃ | Cl⁻ |
| FD-33 | —C₁₈H₃₇ | PTS⁻ |
| FD-34 | —CH₂CH=CH₂ | Cl⁻ |

-continued

FD-35 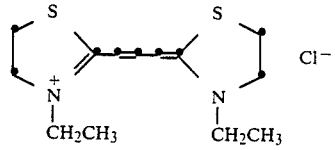

FD-36 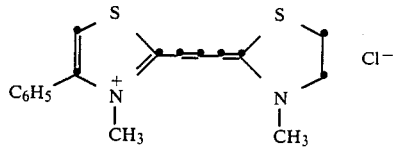

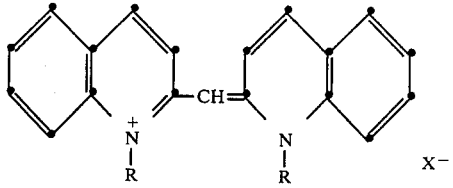

| | R | X⁻ |
|---|---|---|
| FD-37 | —CH₂CH₃ | ClO₄⁻ |
| FD-38 | —C₄H₉ | ClO₄⁻ |
| FD-39 | —C₅H₁₁ | BF₄⁻ |

FD-40 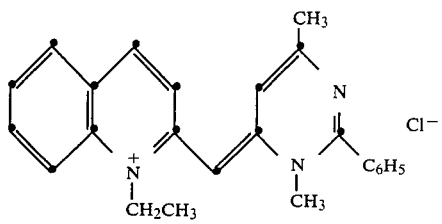

FD-41 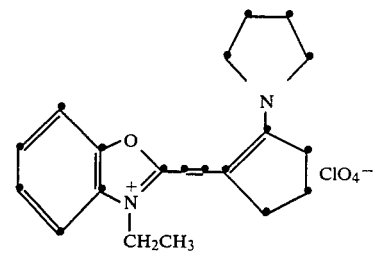

FD-42 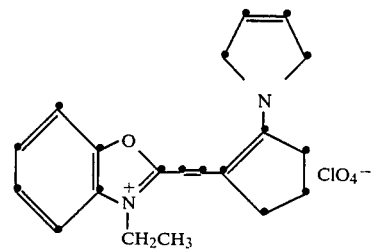

FD-43 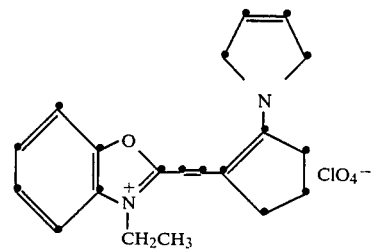

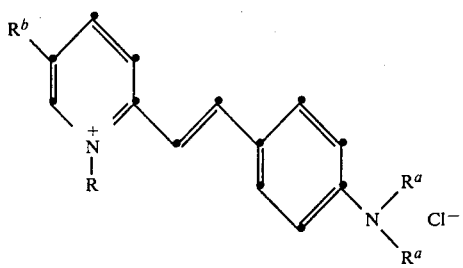

| | $R^a$ | R | $R^b$ |
|---|---|---|---|
| FD-44 | —CH₃ | —CH₃ | H |
| FD-45 | —CH₃ | —CH₃ | —C₂H₃ |
| FD-46 | —C₃H₇ | —CH₃ | H |

FD-47

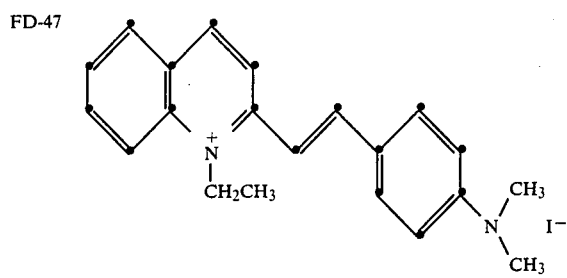

| | n | R | $R^c$ | X⁻ |
|---|---|---|---|---|
| FD-48 | 1 | —CH₃ | C₂H₅ | PTS— |

| | | | | |
|---|---|---|---|---|
| FD-49 | 1 | (CH₂)₃SO₃— | C₅H₁₁ | — |
| FD-50 | 1 | (CH₂)₄SO₃— | C₅H₁₁ | — |
| FD-51 | 2 | (CH₂)₅SO₃— | C₂H₅ | — |
| FD-52 | 3,3′-Ethylenethiacyanine p-toluenesulfonate | | | |
| FD-53 | 1′,3-Ethylenethia-2′-cyanine chloride | | | |
| FD-54 | 1,1′-Ethylene-2,2′-cyanine chloride | | | |
| FD-55 | 3,3′-Ethyleneoxacyanine chloride | | | |
| FD-56 | 1,1′-Diethyl-3,3′-Ethylenebenzimidazolocyanine p-toluenesulfonate | | | |
| FD-57 | 1,1′-Diethyl-3,3′-methylenebenzimidazolocyanine chloride | | | |
| FD-58 | 1,1′-Ethylenecyanine chloride | | | |
| FD-59 | 1,1′-Methylenecyanine chloride | | | |
| FD-60 | 5,5′,6,6′-Tetrachloro-1,1′-diethyl-3,3′-ethanediylbenzimidazolocyanine chloride | | | |
| FD-61 | 5,5′,6,6′-Tetrachloro-1,1′-ethanediyl-3,3′-dimethylbenzimidazolocyanine chloride | | | |
| FD-62 | Anhydro-5,5′,6,6′-tetrachloro-1,1′-ethandiyl-3,3′-bis(3-sulfopropyl)benzimidazolocyanine hydroxide, sodium salt | | | |
| FD-63 | 2,2′-Methanediylbis-(5,6-dichloro-1-methylbenzimidazole | | | |
| FD-64 | 5,5′,6,6′-Tetrachloro-1,1′-dimethyl-3,3′-propanediylbenzimidazolocyanine p-toluenesulfonate | | | |
| FD-65 | 5,5′,6,6′-Tetrachloro-1,1′-dimethyl-3,3′-methanediylbenzimidazolocyanine p-toluenesulfonate | | | |
| FD-66 | 5,5′,6,6′-Tetrachloro-1,1′-ethanediyl-3,3′-bis(2,2,2-trifluoroethyl)benzimidazolocyanine p-toluenesulfonate | | | |
| FD-67 | 5,5′,6,6′-Tetrachloro-1,1′-ethanediyl-3,3′,8-trimethylbenzimidazolocyanine p-toluenesulfonate | | | |

PTS = p-toluenesulfonate

Many polymethine dyes are capable of maximum light absorption at longer visible (>550 nm) wavelengths, with maximum fluorescence wavelengths generally lying in the red and near infrared portions of the spectrum. The following are illustrative of polymethine dyes capable of maximum light absorption at longer visible wavelengths:

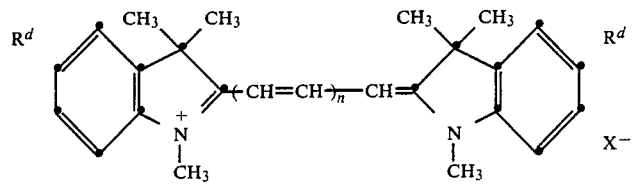

| | n | $R^d$ | X⁻ |
|---|---|---|---|
| FD-68 | 1 | — | BF₄⁻ |
| FD-69 | 2 | — | PTS⁻ |
| FD-70 | 3 | — | BF₄⁻ |
| FD-71 | 3 | —(CH=CH)₂— | ClO₄⁻ |

FD-72

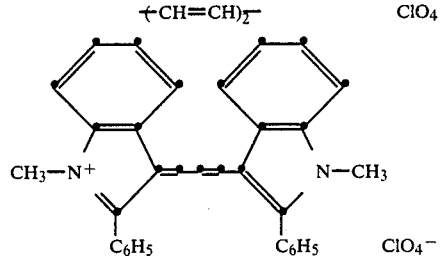

FD-73

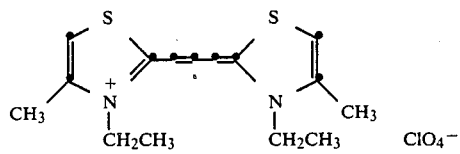

-continued

FD-74 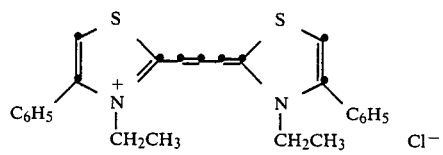

FD-75 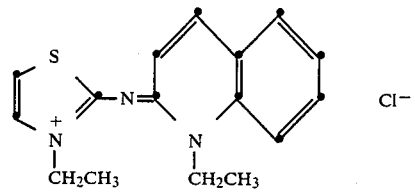

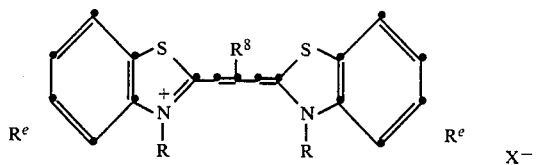

| | R | R$^8$ | R$^e$ | X$^-$ |
|---|---|---|---|---|
| FD-76 | —C$_4$H$_9$ | —H | — | Cl$^-$ |
| FD-77 | —C$_{18}$H$_{37}$ | —H | — | PTS$^-$ |
| FD-78 | —C$_4$H$_9$ | —CH$_3$ | — | Cl$^-$ |
| FD-79 | —C$_5$H$_{11}$ | —CH$_3$ | — | Cl$^-$ |
| FD-80 | —i-C$_3$H$_7$ | —CH$_3$ | — | Cl$^-$ |
| FD-81 | —C$_3$H$_7$ | —C$_2$H$_5$ | — | Cl$^-$ |
| FD-82 | —C$_2$H$_5$ | —C$_2$H$_5$ | — | C$_3$F$_7$COO$^-$ |
| FD-83 | —C$_2$H$_5$ | —C$_6$H$_{11}$ (cyclohexyl) | ($-$CH=CH$-$)$_2$ | Cl$^-$ |
| FD-84 | C$_2$H$_5$ | —C$_{15}$H$_{31}$ | ($-$CH=CH$-$)$_2$ | Cl$^-$ |

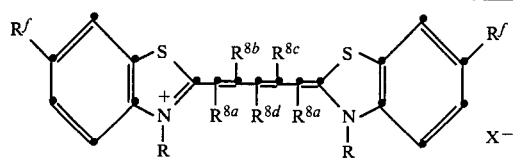

| | R | R$^{8a}$ | R$^{8b}$ | R$^{8c}$ | R$^{8d}$ | R$^f$ | X$^-$ |
|---|---|---|---|---|---|---|---|
| FD-85 | —CH$_2$CH$_3$ | H | H | H | H | H | Cl$^-$ |
| FD-86 | —CH$_2$CH$_3$ | H | H | H | H | —OCH$_3$ | PTS$^-$ |
| FD-87 | —CH$_2$CH$_3$ | H | H | H | —CH$_3$ | H | ClO$_4^-$ |
| FD-88 | —CH$_2$CH$_3$ | H | —CH$_2$—C(CH$_3$)$_2$—CH$_2$— | | | H | H | ClO$_4^-$ |
| FD-89 | —CH$_2$CH$_2$CH$_2$— | H | H | H | H | H | PTS$^-$ |
| FD-90 | —CH$_2$—CH$_2$— | —CH$_2$—C(CH$_3$)$_2$—CH$_2$— | | | H | H | PTS$^-$ |

FD-91 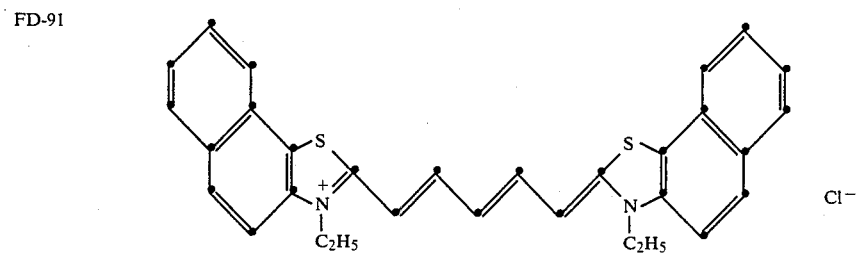

-continued
FD-92 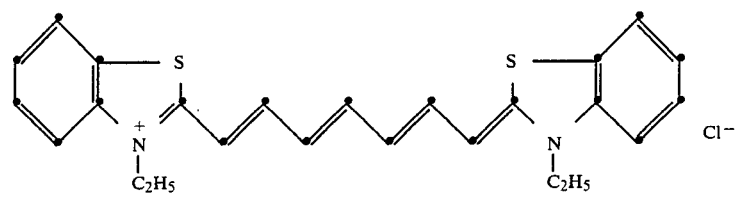
FD-93 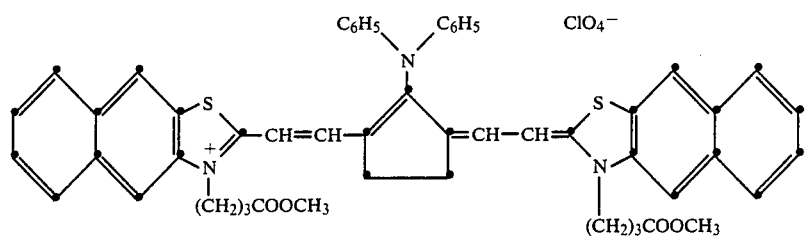
FD-94 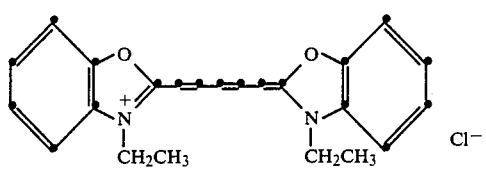
FD-95 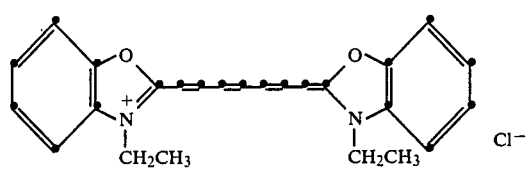
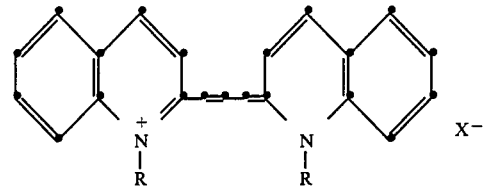
| | R | X⁻ |
|---|---|---|
| FD-96 | —CH$_2$CH$_2$C$_6$H$_5$ | BF$_4^-$ |
| FD-97 | —CH$_2$CH$_3$ | Cl⁻ |
FD-98 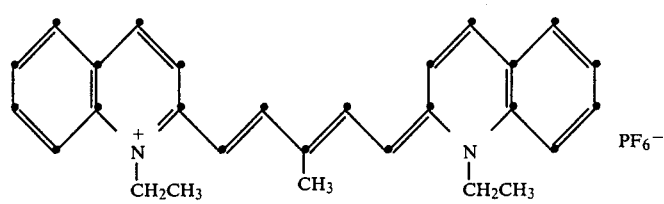
FD-99 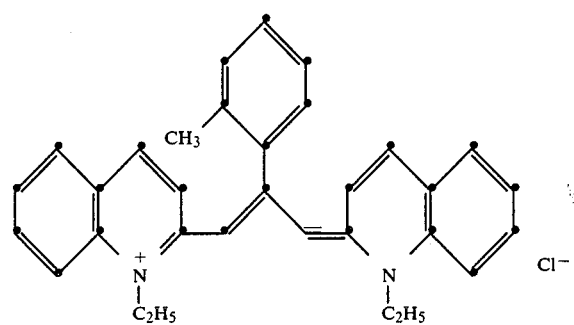

-continued
FD-100 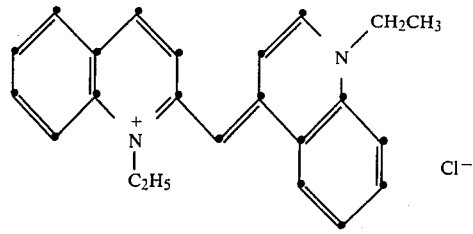
Cl⁻
FD-101 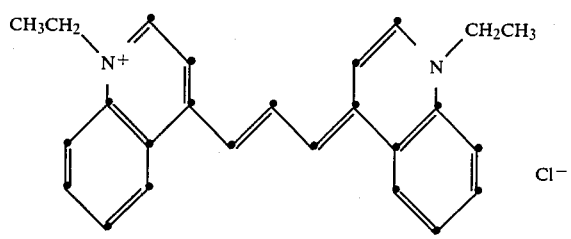
Cl⁻
FD-102 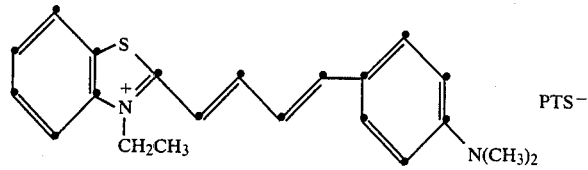
PTS⁻
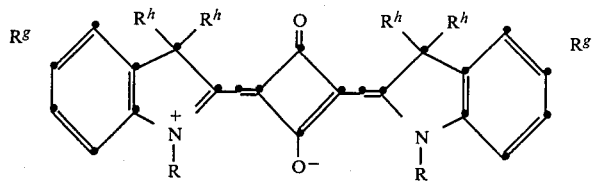
| | $R^h$ | R | $R^g$ |
|---|---|---|---|
| FD-103 | —CH₃ | —CH₃ | — |
| FD-104 | —CH₃ | —CH₃ | ${+}CH{=}CH{+}_2$ |
| FD-105 | —CH₃ | —C₆H₅ | — |
| FD-106 | —CH₃ |  —CH₂—C₆H₄—C₂H₅ | |
FD-107    2 adjacent $R^h$ = ${+}CH_2{+}_5$   i.e., spirocyclohexyl
FD-108
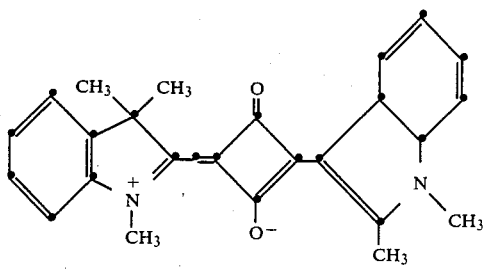

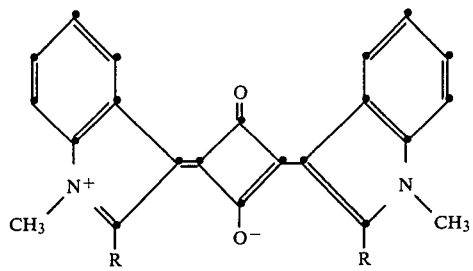

FD-109  R = C₆H₅
FD-110  R = —C₁₀H₇, i.e. α-naphthyl

FD-111

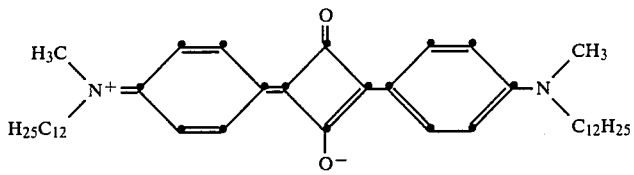

FD-112

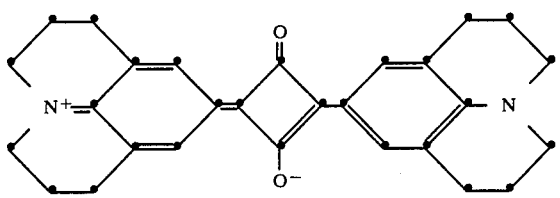

FD-113

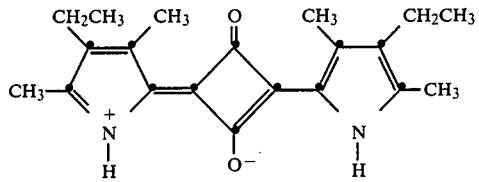

---

Another useful class of fluorescent dyes are 4-oxo-4H-benz-[d,e]anthracenes, hereinafter referred to as oxobenzanthracene dyes. Dyes of this class and their preparations are disclosed in Goswami et al U.S. Ser. No. 824,765, filed Jan. 31, 1986, commonly assigned, titled FLUORESCENT DYES AND BIOLOGICAL AND ANALYTICAL USES THEREOF. Preferred fluorescent oxobenzanthracene dyes are those represented by formula XII:

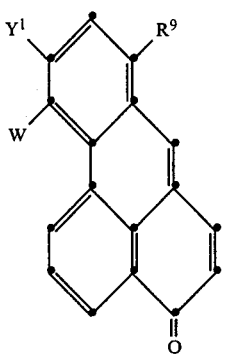

(XII)

In this structure, $R^9$ is hydrogen, substituted or unsubstituted alkyl (preferably of 1 to 12 carbon atoms, e.g. methyl, ethyl, isopropyl, benzyl, phenethyl, etc.), substituted or unsubstituted hydroxyalkyl (preferably of 1 to 12 carbon atoms, e.g. hydroxymethyl, 2-hydroxyethyl, 2-hydroxyisopropyl, etc.), or substituted or unsubstituted alkoxycarbonyl (preferably of 2 to 12 carbon atoms, e.g. methoxycarbonyl, ethoxycarbonyl, n-propoxycarbonyl, etc.). Preferably, $R^9$ is hydrogen, substituted or unsubstituted alkyl or substituted or unsubstituted alkoxycarbonyl, and more preferably, it is substituted or unsubstituted alkoxycarbonyl.

W is hydrogen or an electron withdrawing group as that term is understood in the art (i.e. a group generally having a positive Hammett sigma value as determined by standard procedures). Particularly useful electron withdrawing groups include, but are not limited to, halo (e.g. fluoro, chloro, bromo), cyano, carboxy, acyl, substituted or unsubstituted arylsulfonyl (preferably of 6 to 10 carbon atoms, e.g. phenylsulfonyl, tolylsulfonyl, etc.), substituted or unsubstituted alkylsulfonyl (preferably of 1 to 6 carbon atoms, e.g. methylsulfonyl, ethylsulfonyl, etc.), substituted and unsubstituted dialkylphosphinyl (preferably where each alkyl group independently has 1 to 10 carbon atoms, e.g. methyl, ethyl, butyl, decyl, etc.) and substituted or unsubstituted dialkyl phosphono (preferably where each alkyl group independently has 1 to 10 carbon atoms as defined above). Preferably, W is hydrogen or halo.

$Y^1$ is hydrogen, or a group comprised of a heteroatom having a lone pair of electrons or a negative charge with an associated cation, e.g. hydroxy, mercapto or amino (—N″R‴). R″ and R‴ are independently substituted or unsubstituted alkyl (preferably of 1 to 10 carbons, e.g., methyl, ethyl, decyl, etc.) substituted or unsubstituted aryl (preferably of 6 to 10 carbons, e.g., phenyl, naphthyl, etc.), or R" and R'", taken together, can represent the atoms necessary to complete a substituted or unsubstituted heterocyclic ring (preferably of 5 to 10 carbon, nitrogen or oxygen atoms, e.g. a morpholino, pyrrolidinyl, pyridyl, piperidino, etc. ring). $Y^1$ can also be substituted or unsubstituted alkoxy (preferably of 1 to 10 carbon atoms, e.g. methoxy, ethoxy, 2-chloro-1-propoxy, etc.), substituted or unsubstituted carbamyloxy

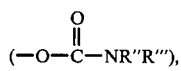
$(-O-\overset{O}{\overset{\|}{C}}-NR''R''')$, wherein R" and R'" are defined above, $-O^-M^+$ or $-S^-M^+$, wherein $M^+$ is a monovalent cation, e.g. $Na^+$, $K^+$, $Li^+$, $NH_4^+$, etc. Preferably $Y^1$ is hydroxy or $-O^-M^+$.

|  | $R^9$ | W | $Y^1$ |
| --- | --- | --- | --- |
| FD-114 | Methyl | Hydrogen | Hydroxy |
| FD-115 | Methyl | Hydrogen | $-O^-Na^+$ |
| FD-116 | Methyl | Chloro | Hydroxy |
| FD-117 | Methyl | Chloro | $-O^-Na^+$ |
| FD-118 | Methyl | Chloro | N—methyl-N—phenylcarbamyloxy |
| FD-119 | Methyl | Hydrogen | Pyrrolidinyl |
| FD-120 | Butoxycarbonyl | Hydrogen | Hydroxy |
| FD-121 | Butoxycarbonyl | Hydrogen | $-O^-Na^+$ |
| FD-122 | Butoxycarbonyl | Chloro | $-O^-Na^+$ |

The oxobenzanthracene dyes illustrated above can have one or more substituents other than those specifically illustrated in the structure as long as the substituents do not adversely affect the fluorescence of the compound, such as alkyl (e.g., alkyl of 1 to 5 carbon atoms), aryl (e.g., phenyl), and other groups.

The oxobenzanthracene dyes can be prepared generally using the following procedure. The details of several preparations are provided in APPENDIX I below. The general preparatory procedure includes: (1) preparation of a dihydrophenalenone by the procedure described by Cooke et al, *Australian J. Chem.*, 11, pp. 230–235 (1958), (2) preparation of the lithium enolate of the dihydrophenalenone, (3) reaction of the lithium enolate with the appropriate phosphonium iodide reagent, and (4) reaction of this product with cupric chloride and lithium chloride to produce the chlorinated or unchlorinated dye.

Another useful class of fluorescent dyes are xanthene dyes. One particularly preferred class of xanthene dyes are rhodamine dyes. Preferred fluorescent rhodamine dyes are those represented by formula XIII:

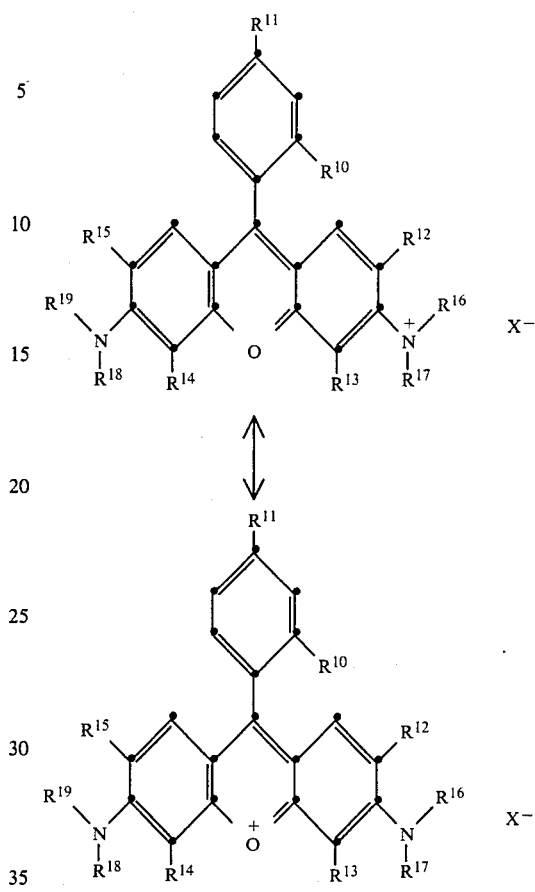

where
$R^{10}$ and $R^{11}$ are independently hydrogen, carboxyl, sulfonyl, alkanoyl, or alkoxycarbonyl groups;
$R^{12}$, $R^{13}$, $R^{14}$, and $R^{15}$ are hydrogen;
$R^{16}$, $R^{17}$, $R^{18}$, and $R^{19}$ are alkyl groups; and
$X^-$ is an anion; or
any one of or all of following substituent pairs: $R^{12}$ and $R^{16}$, $R^{13}$ and $R^{17}$, $R^{14}$ and $R^{18}$, and $R^{15}$ and $R^{19}$, complete five or six membered ring containing nitrogen as the sole heteroatom.

The alkyl moieties in each instance contain from 1 to 5 carbon atoms, preferably 1 to 3 carbon atoms. When substituent pairs complete a fused ring, the ring can, for example, take the form of a pyran ring when a single fused ring including a formula nitrogen atom is formed or a julolidene ring (including a formula fused benzo ring) when two fused rings each including the same nitrogen atom of the formula are formed.

The following are illustrative of rhodamine dyes known to be useful laser dyes:

FD-123 [9-(o-Carboxyphenyl)-6-(diethylamino)-3H-xanthen-3-ylidene]diethyl ammonium chloride [a.k.a rhodamine B]

FD-124 N-{6-[Diethylamino]-9-[2-(ethoxycarbonyl)-phenyl]-3H-xanthen-3-ylidene}-N-ethylethanaminium perchlorate FD-125 Ethyl o-[6-(Ethylamino)-3-(ethylimino)-2,7-dimethyl-3H-xanthenyl]benzoate chloride FD-126 Ethyl o-[6-(ethylamino)-3-(ethylimino)-2,7-dimethyl-3H-xanthenyl]benzoate perchlorate FD-127 Ethyl o-[6-(ethylamino)-3-(ethylimino)-2,7-dimethyl-3H-xanthenyl]benzoate tetrafluoroborate FD-128 o-[6-(Ethylamino)-3-(ethylimino)-2,7-dimethyl-3H-xanthenyl]benzoic acid FD-129 o-(6-Amino-3-imino-3H-xanthenyl)benzoic acid hydrochloride FD-130 o-[6-Methylamino)-3-methylimino)-3H-xanthen-9-yl]benzoic acid perchlorate FD-131 Methyl o-(6-amino-3'-imino-3H-xanthen-9-yl)benzoate monohydrochloride FD-132 8-(2,4-Disulfophenyl)-2,3,5,6,11,12,14,15-1H,4H,10H,13H-octahydroquinolizino[9,9a,1-bc;9,9a1-hi]xanthylium hydroxide inner salt FD-133 Sulforhodamine B FD-134 o-[6-(Dimethylamino)-3-(dimethylamino)-3H-xanthen-9-yl]benzoic acid perchlorate Another specifically preferred class of xanthene dyes are fluorescein dyes. Preferred fluorescein dyes are those represented by formula XIV:

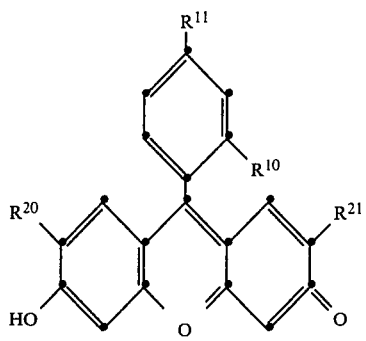

(XIV)

where $R^{10}$ and $R^{11}$ are as previously defined and $R^{20}$ and $R^{21}$ are hydrogen, alkyl, aryl, or halo substituents. Preferred alkyl groups contain from 1 to 5, optimally from 1 to 3 carbon atoms while phenyl is a preferred aryl group.

An illustrative fluorescein dye is

FD-135 9-(o-Carboxyphenyl)-6-hydroxy-3H-xanthen-3-one

FD-136 9-(o-Carboxyphenyl)-2,7-dichloro-6-hydroxy-3H-xanthen-3-one

Another useful group of fluorescent dyes are pyrylium, thiapyrylium, selenapyrylium, and telluropyrylium dyes. Dyes from the first three of these classes are disclosed by Light U.S. Pat. No. 3,615,414 while dyes of the latter class are disclosed by Detty U.S. Pat. No. 4,584,258, the disclosures of which are here incorporated by reference. Since the latter two classes of dyes are bathochromically shifted toward the infrared the former two classes of dyes are preferred for achieving visible light emissions.

Illustrative preferred fluorescent pyrylium and thiapyrylium dyes are represented by formula XV:

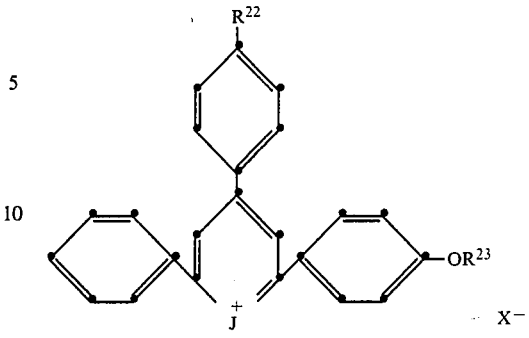

(XV)

where $R^{22}$ is hydrogen, methyl, or a tertiary amino group, optimally a $-NR^{23}R^{23}$ group;

$R^{23}$ is an alkyl group;

$X^-$ is an anion; and

J is oxygen or sulfur.

The alkyl group preferably contains from 1 to 5 carbon atoms and optimally from 1 to 3 carbon atoms. Illustrative pyrylium and thiapyrylium fluorescent dyes satisyfing formula XV are the following:

FD-137 4-(4-dimethylaminophenyl)-2-(4-methoxyphenyl)-6-phenylpyrylium perchlorate FD-138 4,6-diphenyl-2-(4-ethoxyphenyl)thiapyrylium p-toluenesulfonate FD-137 2-(4-methoxyphenyl)-6-phenyl-4-(p-tolyl)-pyrylium tetrafluoroborate Another useful class of fluorescent dyes are fluorescent carbostyril dyes. These dyes are characterized by a 2-quinolinol or isoquinolinol ring structure, often fused with other rings. The wavelength of maximum fluorescence generally increases with the presence of other fused rings. Typical of simple carbostyril dyes, which fluoresce in the blue portion of the spectrum, are the following:

FD-140 7-Amino-4-methyl-2-quinolinol [a.k.a. 7-amino-4-methylcarbostyrill]

FD-141 7-Dimethylamino-2-hydroxy-4-methylquinoline [a.k.a. 7-dimethylamino-4-methylcarbostyryl]

FD-142 3,3'-Bis[N-phenylisoquinoline]

Examples of more complex fused ring carbostyril dyes are provided by Kadhim and Peters, "New Intermediates and Dyes for Synthetic Polymer Fibres Substituted Benzimidazolothioxanthenoisoquinolines for Polyester Fibres", JSDC, June 1974, pp. 199–201, and Arient et al, "Imidazole Dyes XX-Colouring Properties of 1,2-Napthooxylenebenzimidazole Derivatives", JSDC, June 1968, pp. 246–251. Illustrative of these more complex carbostyril dyes are the following:

FD-143 Benzimidazo[1,2-b]thioxantheno[2,1,9,d,e,f-]isoquinolin-7-one and its stereo isomer Benzimidazo[1,2-a]thioxantheno[2,1,9,d,e,f]isoquinolin-7-one Among other fused ring fluorescent dyes the perylene dyes, characterized by a dinapthylene nucleus. A variety of useful fluorescent perylene dyes are known, such as, for example those disclosed by Rademacher et al, "Soluble Perylene Fluorescent Dyes with Photostability", Chem. Ber., Vol. 115, pp. 2927–2934, 1982, and European Patent Application No. 553,363A1, published July 7, 1982. One preferred perylene dye is illustrated by formula XVI:

where $R^{24}$ and $R^{25}$ are independently selected from the group consisting of alkyl, halo, and haloalkyl substituents. Preferred alkyl groups having from 1 to 5 carbon atoms, optimally from 1 to 3 carbon atoms.

Another preferred group of perylene dyes are the 3,4,9,10-perylenebis(dicarboximides), hereinafter referred to a perylenebis(dicarboximide) dyes. Preferred dyes of this class are represented by formula XVII:

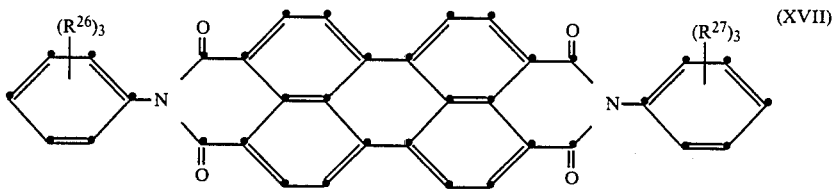

where $R^{26}$ and $R^{27}$ are independently selected from the group consisting of alkyl, halo, and haloalkyl substituents. Preferred alkyl groups having from 1 to 5 carbon atoms, optimally from 1 to 3 carbon atoms.

Illustrative of preferred perylene dyes are the following:

FD-144 Perylene
FD-145 1,2-Bis(5,6-o-phenylenenaphthalene)
FD-146 N,N'-diphenyl-3,4,9,10-perylenebis(dicarboximide)
FD-147 N,N'-di(p-tolyl)-3,4,9,10-perylenebis(dicarboximide)
FD-148 N,N'-di(2,6-di-t-butyl)-3,4,9,10-perylenebis(dicarboximide)

The foregoing listing of preferred fluorescent dyes useful in combination with the host materials, though lengthy, is recognized to be only exemplary of known fluorescent dyes, both in the classes specifically identified and in still other dye classes. For example, many other classes of known fluorescent dyes, such as acridine dyes; bis(styryl)benzene dyes; pyrene dyes; oxazine dyes; and phenyleneoxide dyes, sometimes referred to as POPOP dyes; are useful, specific illustrative dyes from these classes including the following:

FD-149 9-Aminoacridine hydrochloride
FD-150 p-Bis(o-methylstyryl)benzene
FD-151 2,2'-p-Phenylenebis(4-methyl-5-phenyloxazole)
FD-152 5,9-Diaminobenzo[a]phenoxazonium perchlorate
FD-153 5-Amino-9-diethylaminobenz[a]phenoxazonium perchlorate
FD-154 3,7-Bis(diethylamino)phenoxazonium perchlorate
FD-155 3,7-Bis(ethylamino)-2,8-dimethylphenoxazin-5-ium perchlorate
FD-156 9-Ethylamino-5-ethylimino-10-methyl-5H-benzo[a]phenoxazonium perchlorate
FD-157 8-Hydroxy-1,3,6-pyrene-trisulfonic acid trisodium salt Not only are there many available classes of fluorescent dyes to choose from, there are wide choices of individual dye properties within any given class. The absorption maxima and reduction potentials of individual dyes can be varied through the choice of substituents. As the conjugation forming the chromophore of the dye is increased the absorption maximum of a dye can be shifted bathochromically.

Emission maxima are bathochromic to the absorption maxima. Although the degree of bathochromic shifting can vary as a function of the dye class, usually the wavelength of maximum emission is from 25 to 125 nm bathochromically shifted as compared to the wavelength of maximum absorption. Thus, dyes which exhibit absorption maxima in the near ultraviolet in almost all cases exhibit maximum emissions in the blue portion of the spectrum. Dyes which exhibit absorption maxima in the blue portion of the spectrum exhibit emission maxima in the green portion of the spectrum, and, similarly, dyes with absorption maxima in the red portion of the spectra tend to exhibit emission maxima in the near infrared portion of the spectrum.

In one form of the invention the material forming the luminescent zone can be one uniform layer interposed between and contacting both the cathode and the hole injection zone of the EL device. As an alternative construction a separate layer containing the host material, but lacking the fluorescent material, can be interposed between the luminescent zone and the cathode. Although the additional interposed organic electron injection layer can be of any conventional form, it is preferred that both the electron injection layer and the layer forming the luminescent zone be present in the form of a thin film ($<1$ $\mu$m in thickness) and most preferred that these layers have a combined thickness no greater than those thicknesses indicated above for the luminescent zone.

The organic luminescent medium of the EL devices of this invention preferably contains at least two separate organic layers, at least one layer forming a zone for transporting electrons injected from the cathode and at least one layer forming a zone for transporting holes injected from the anode. As is more specifically taught by Van Slyke et al U.S. Ser. No. 013,528, filed Feb. 11, 1987, commonly assigned, titled ELECTROLUMINESCENT DEVICE WITH ORGANIC LUMINESCENT MEDIUM, cited above, the latter zone is in turn preferably formed of at least two layers, one, located in contact with the anode, providing a hole injecting zone and the remaining layer, interposed between the layer forming the hole injecting zone and the layer providing the electron transporting zone, providing a hole transporting zone. While the description which follows is directed to the preferred embodiments of organic EL devices according to this invention which employ at least three separate organic layers, as taught by Van Slyke et al, it is appreciated that either the layer forming the hole injecting zone or the layer forming the hole transporting zone can be omitted and the remaining layer will perform both functions. Higher initial and sustained performance levels of the organic EL devices of this invention are realized when the separate hole injecting and hole transporting layers described below are employed in combination.

A layer containing a porphyrinic compound forms the hole injecting zone of the organic EL device. A porphyrinic compound is any compound, natural or synthetic, which is derived from or includes a porphyrin structure, including porphine itself. Any of the prophyrinic compounds disclosed by Adler U.S. Pat. No. 3,935,031 or Tang U.S. Pat. No. 4,356,429, the disclosures of which are here incorporated by reference, can be employed.

Preferred porphyrinic compounds are those of structural formula (XVIII):

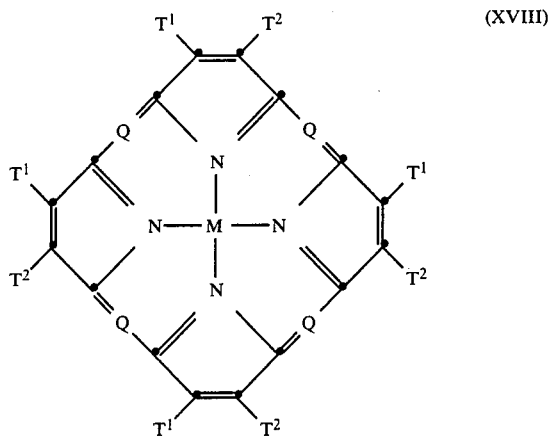

wherein
Q is —N= or —C(R)=;
M is a metal, metal oxide, or metal halide;
R is hydrogen, alkyl, aralkyl, aryl, or alkaryl, and
$T^1$ and $T^2$ represent hydrogen or together complete a unsaturated 6 membered ring, which can include substituents, such as alkyl or halogen.

Preferred 6 membered rings are those formed of carbon, sulfur, and nitrogen ring atoms. Preferred alkyl moieties contain from about 1 to 6 carbon atoms while phenyl constitutes a preferred aryl moiety.

In an alternative preferred form the porphyrinic compounds differ from those of structural formula (XVIII) by substitution of two hydrogen for the metal atom, as indicated by formula (IXX):

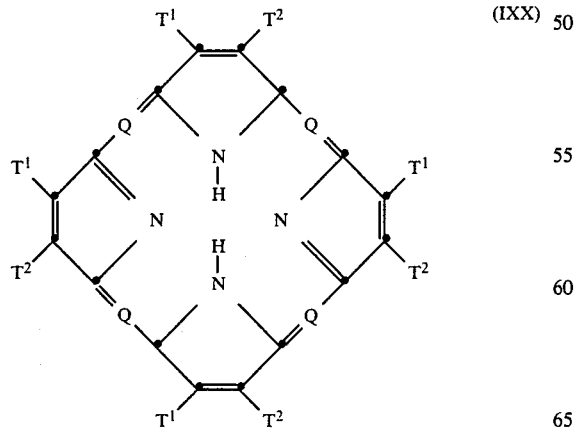

Highly preferred examples of useful prophyrinic compounds are metal free phthalocyanines and metal containing phthalocyanines. While the porphyrinic compounds in general and the phthalocyanines in particular can contain any metal, the metal preferably has a positive valence of two or higher. Exemplary preferred metals are cobalt, magnesium, zinc, palladium, nickel, and, particularly, copper, lead, and platinum.

Illustrative of useful porphyrinic compounds are the following:
PC-1 Porphine
PC-2 1,10,15,20-Tetraphenyl-21H,23H-porphine copper (II)
PC-3 1,10,15,20-Tetraphenyl-21H,23H-porphine zinc (II)
PC-4 5,10,15,20-Tetrakis(pentafluorophenyl)-21H,23H-porphine
PC-5 Silicon phthalocyanine oxide
PC-6 Aluminum phthalocyanine chloride
PC-7 Phthalocyanine (metal free)
PC-8 Dilithium phthalocyanine
PC-9 Copper tetramethylphthalocyanine
PC-10 Copper phthalocyanine
PC-11 Chromium phthalocyanine fluoride
PC-12 Zinc phthalocyanine
PC-13 Lead phthalocyanine
PC-14 Titanium phthalocyanine oxide
PC-15 Magnesium phthalocyanine
PC-16 Copper octamethylphthalocyanine The hole transporting layer of the organic EL device contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinylene radicals and/or containing at least one active hydrogen containing group are disclosed by Brantley et al U.S. Pat. Nos. 3,567,450 and 3,658,520.

A preferred class of aromatic tertiary amines are those which include at least two aromatic tertiary amine moieties. Such compounds include those represented by structural formula (XX):

wherein
$Q^1$ and $Q^2$ are independently aromatic tertiary amine moieties and
G is a linking group such an arylene, cycloalkylene, or alkylene group or a carbon to carbon bond.

A particularly preferred class of class of triarylamines satisfying structural formula (XX) and containing two triarylamine moieties are those satisfying structural formula (XXI):

where $R^{24}$ and $R^{25}$ each independently represents a hydrogen atom, an aryl group, or an alkyl group or $R^{24}$ and $R^{25}$ together represent the atoms completing a cycloalkyl group and $R^{26}$ and $R^{27}$ each independently represents an aryl group which is in turn substituted with a diaryl substituted amino group, as indicated by structural formula (XXII):

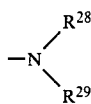

(XXII)

wherein $R^{28}$ and $R^{29}$ are independently selected aryl groups.

Another preferred class of aromatic tertiary amines are tetraaryldiamines. Preferred tetraaryldiamines include two diarylamino groups, such as indicated by formula (XXII), linked through an arylene group. Preferred tetraaryldiamines include those represented by formula (XXIII).

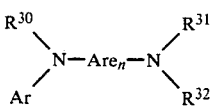

(XXIII)

wherein
Are is an arylene group,
n is an integer of from 1 to 4, and
Ar, $R^{30}$, $R^{31}$, and $R^{32}$ are independently selected aryl groups.

The various alkyl, alkylene, aryl, and arylene moieties of the foregoing structural formulae (XX), (XXI), (XXII), and (XXIII) can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are preferably phenyl and phenylene moieties.

While the entire hole transporting layer of the organic electroluminesce medium can be formed of a single aromatic tertiary amine, it is a further recognition of this invention that increased stability can be realized by employing a combination of aromatic tertiary amines. Specifically, as demonstrated in the examples below, it has been observed that employing a triarylamine, such as a triarylamine satisfying formula (XXI), in combination with a tetraaryldiamine, such as indicated by formula (XXIII), can be advantageous. When a triarylamine is employed in combination with a tetraaryldiamine, the latter is positioned as a layer interposed between the triarylamine and the electron injecting and transporting layer.

Representative useful aromatic tertiary amines are disclosed by Berwick et al U.S. Pat. No. 4,175,960 and Van Slyke et al U.S. Pat. No. 4,539,507, here incorporated by reference. Berwick et al in addition discloses as useful hole transporting compounds N substituted carbazoles, which can be viewed as ring bridged variants of the diaryl and triarylamines disclosed above.

Illustrative of useful aromatic tertiary amines are the following:

ATA-1 1,1-Bis(4-di-p-tolylaminophenyl)cyclohexane
ATA-2 1,1-Bis(4-di-p-tolylaminophenyl)-4-phenylcyclohexane
ATA-3 4,4'-Bis(diphenylamino)quadriphenyl
ATA-4 Bis(4-dimethylamino-2-methylphenyl)-phenylmethane
ATA-5 N,N,N-Tri(p-tolyl)amine
ATA-6 4-(di-p-tolylamino)-4'-[4(di-p-tolylamino)-styryl]stilbene
ATA-7 N,N,N',N'-Tetra-p-tolyl-4,4'-diaminobiphenyl
ATA-8 N,N,N',N'-Tetraphenyl-4,4'-diaminobiphenyl
ATA-9 N-Phenylcarbazole
ATA-10 Poly(N-vinylcarbazole)

Any conventional electron injecting and transporting compound or compounds can be employed in forming the layer of the organic luminescent medium adjacent the cathode. This layer can be formed by historically taught luminescent materials, such as anthracene, naphthalene, phenanthrene, pyrene, chrysene, and perylene and other fused ring luminsecent materials containing up to about 8 fused rings as illustrated by Gurnee et al U.S. Pat. No. 3,172,862, Gurnee U.S. Pat. No. 3,173,050, Dresner, "Double Injection Electroluminescence in Anthracene", *RCA Review*, Vol. 30, pp. 322-334, 1969; and Dresner U.S. Pat. No. 3,710,167, cited above. Although such fused ring luminescent materials do not lend themselves to forming thin ($<1$ μm) films and therefore do not lend themselves to achieving the highest attainable EL device performance levels, organic EL devices incorporating such luminescent materials when constructed according to the invention show improvements in performance and stability over otherwise comparable prior art EL devices.

In the organic EL devices of the invention it is possible to maintain a current density compatible with efficient light emission while employing a relatively low voltage across the electrodes by limiting the total thickness of the organic luminescent medium to less than 1 μm (10,000 Angstroms). At a thickness of less than 1 μm an applied voltage of 20 volts results in a field potential of greater than $2 \times 10^5$ volts/cm, which is compatible with efficient light emission. An order of magnitude reduction (to 0.1 μm or 1000 Angstroms) in thickness of the organic luminescent medium, allowing further reductions in applied voltage and/or increase in the field potential and hence current density, are well within device construction capabilities.

One function which the organic luminescent medium performs is to provide a dielectric barrier to prevent shorting of the electrodes on electrical biasing of the EL device. Even a single pin hole extending through the organic luminescent medium will allow shorting to occur. Unlike conventional EL devices employing a single highly crystalline luminescent material, such as anthracene, for example, the EL devices of this invention are capable of fabrication at very low overall organic luminescent medium thicknesses without shorting. One reason is that the presence of three superimposed layers greatly reduces the chance of pin holes in the layers being aligned to provide a continuous conduction path between the electrodes. This in itself permits one or even two of the layers of the organic luminescent medium to be formed of materials which are not ideally suited for film formation on coating while still achieving acceptable EL device performance and reliability.

The preferred materials for forming the organic luminescent medium are each capable of fabrication in the form of a thin film—that is, capable of being fabricated as a continuous layer having a thickness of less than 0.5 μm or 5000 Angstroms.

When one or more of the layers of the organic luminescent medium are solvent coated, a film forming polymeric binder can be conveniently codeposited with the active material to assure a continuous layer free of structural defects, such as pin holes. If employed, a binder must, of course, itself exhibit a high dielectric strength, preferably at least about $2 \times 10^6$ volt/cm. Suitable polymers can be chosen from a wide variety of known solvent cast addition and condensation polymers. Illustrative of suitable addition polymers are polymers and copolymers (including terpolymers) of styrene, t-butylstyrene, N-vinyl carbazole, vinyltoluene, methyl methacrylate, methyl acrylate, acrylonitrile, and vinyl acetate. Illustrative of suitable condensation polymers are polyesters, polycarbonates, polyimides, and polysulfones. To avoid unnecessary dilution of the active material, binders are preferably limited to less than 50 percent by weight, based on the total weight of the material forming the layer.

The preferred active materials forming the organic luminescent medium are each film forming materials and capable of vacuum vapor deposition. Extremely thin defect free continuous layers can be formed by vacuum vapor deposition. Specifically, individual layer thicknesses as low as about 50 Angstroms can be present while still realizing satisfactory EL device performance. Employing a vacuum vapor deposited porphorinic compound as a hole injecting layer, a film forming aromatic tertiary amine as a hole transporting layer (which can in turn be comprised of a triarylamine layer and a tetraaryldiamine layer), and a chelated oxinoid compound as an electron injecting and transporting layer, individual layer thicknesses in the range of from about 50 to 5000 Angstroms are contemplated, with layer thicknesses in the range of from 100 to 2000 Angstroms being preferred. It is generally preferred that the overall thickness of the organic luminescent medium be at least about 1000 Angstroms.

The anode and cathode of the organic EL device can each take any convenient conventional form. Where it is intended to transmit light from the organic EL device through the anode, this can be conveniently achieved by coating a thin conductive layer onto a light transmissive substrate—e.g., a transparent or substantially transparent glass plate or plastic film. In one form the organic EL devices of this invention can follow the historical practice of including a light transmissive anode formed of tin oxide or indium tin oxide coated on a glass plate, as disclosed by Gurnee et al U.S. Pat. No. 3,172,862, Gurnee U.S. Pat. No. 3,173,050, Dresner, "Double Injection Electroluminescence in Anthracene", RCA Review, Vol. 30, pp. 322-334, 1969; and Dresner U.S. Pat. No. 3,710,167, cited above. While any light transmissive polymeric film can be employed as a substrate, Gillson U.S. Pat. No. 2,733,367 and Swindells U.S. Pat. No. 2,941,104 disclose polymeric films specifically selected for this purpose.

As employed herein the term "light transmissive" means simply that the layer or element under discussion transmits greater than 50 percent of the light of at least one wavelength it receives and preferably over at least a 100 nm interval. Since both specular (unscattered) and diffused (scattered) emitted light are desirable device outputs, both translucent and transparent or substantially transparent materials are useful. In most instances the light transmissive layers or elements of the organic EL device are also colorless or of neutral optical density—that is, exhibiting no markedly higher absorption of light in one wavelength range as compared to another. However, it is, of course, recognized that the light transmissive electrode supports or separate superimposed films or elements can be tailored in their light absorption properties to act as emission trimming filters, if desired. Such an electrode construction is disclosed, for example, by Fleming U.S. Pat. No. 4,035,686. The light transmissive conductive layers of the electrodes, where fabricated of thicknesses approximating the wavelengths or multiples of the light wavelengths received can act as interference filters.

Contrary to historical practice, in one preferred form the organic EL devices of this invention emit light through the cathode rather than the anode. This relieves the anode of any requirement that it be light transmissive, and it is, in fact, preferably opaque to light in this form of the invention. Opaque anodes can be formed of any metal or combination of metals having a suitably high work function for anode construction. Preferred anode metals have a work function of greater than 4 electron volts (eV). Suitable anode metals can be chosen from among the high (>4 eV) work function metals listed below. An opaque anode can be formed of an opaque metal layer on a support or as a separate metal foil or sheet.

The organic EL devices of this invention can employ a cathode constructed of any metal, including any high or low work function metal, heretofore taught to be useful for this purpose. Unexpected fabrication, performance, and stability advantages have been realized by forming the cathode of a combination of a low work function metal and at least one other metal. A low work function metal is herein defined as a metal having a work function of less than 4 eV. Generally the lower the work function of the metal, the lower the voltage required for electron injection into the organic luminescent medium. However, alkali metals, the lowest work function metals, are too reactive to achieve stable EL device performance with simple device constructions and construction procedures and are excluded (apart from impurity concentrations) from the preferred cathodes of this invention.

Available low work function metal choices for the cathode (other alkali metals) are listed below by periods of the Periodic Table of Elements and categorized into 0.5 eV work function groups. All work functions provided are taken Sze, *Physics of Semiconductor Devices*, Wiley, N.Y., 1969, p. 366.

| Period | Element | Work Function By eV Group |
| --- | --- | --- |
| 2 | Beryllium | 3.5–4.0 |
| 3 | Magnesium | 3.5–4.0 |
| 4 | Calcium | 2.5–3.0 |
|   | Scandium | 3.0–3.5 |
|   | Titanium | 3.5–4.0 |
|   | Manganese | 3.5–4.0 |
|   | Gallium | 3.5–4.0 |
| 5 | Strontium | 2.0–2.5 |
|   | Yttrium | 3.0–3.5 |
|   | Indium | 3.5–4.0 |
| 6 | Barium | ~2.5 |
|   | Lanthanum | 3.0–3.5 |
|   | Cerium | 2.5–3.0 |

-continued

| Period | Element | Work Function By eV Group |
|---|---|---|
|   | Praseodymium | 2.5–3.0 |
|   | Neodymium | 3.0–3.5 |
|   | Promethium | 3.0–3.5 |
|   | Samarium | 3.0–3.5 |
|   | Europium | 2.5–3.0 |
|   | Gadolinium | 3.0–3.5 |
|   | Terbium | 3.0–3.5 |
|   | Dysprosium | 3.0–3.5 |
|   | Holmium | 3.0–3.5 |
|   | Erbium | 3.0–3.5 |
|   | Thulium | 3.0–3.5 |
|   | Ytterbium | 2.5–3.0 |
|   | Lutetium | 3.0–3.5 |
|   | Hafnium | ~3.5 |
| 7 | Radium | 3.0–3.5 |
|   | Actinium | 2.5–3.0 |
|   | Thorium | 3.0–3.5 |
|   | Uranium | 3.0–3.5 |

From the foregoing listing it is apparent that the available low work function metals for the most part belong to the Group IIa or alkaline earth group of metals, the Group III group of metals (including the rare earth metals—i.e. yttrium and the lanthanides, but excluding boron and aluminum), and the actinide groups of metals. The alkaline earth metals, owing to their ready availability, low cost, ease of handling, and minimal adverse environmental impact potential, constitute a preferred class of low work function metals for use in the cathodes of EL devices of this invention. Magnesium and calcium are particularly preferred. Though significantly more expensive, the included Group III metals, particularly the rare earth metals, possess similar advantages and are specifically contemplated as preferred low work function metals. The low work function metals exhibiting work functions in the range of from 3.0 to 4.0 eV are generally more stable than metals exhibiting lower work functions and are therefore generally preferred.

A second metal included in the construction of the cathode has as one primary purpose to increase the stability (both storage and operational) of the cathode. It can be chosen from among any metal other than an alkali metal. The second metal can itself be a low work function metal and thus be chosen from the metals listed above having a work function of less than 4 eV, with the same preferences above discussed being fully applicable. To the extent that the second metal exhibits a low work function it can, of course, supplement the first metal in facilitating electron injection.

Alternatively, the second metal can be chosen from any of the various metals having a work function greater than 4 eV, which includes the elements more resistant to oxidation and therefore more commonly fabricated as metallic elements. To the extent the second metal remains invariant in the organic EL device as fabricated, it contributes to the stability of the device.

Available higher work function (4 eV or greater) metal choices for the cathode are listed below by periods of the Periodic Table of Elements and categorized into 0.5 eV work function groups.

| Period | Element | Work Function By eV Group |
|---|---|---|
| 2 | Boron | ~4.5 |
|   | Carbon | 4.5–5.0 |
| 3 | Aluminum | 4.0–4.5 |

-continued

| Period | Element | Work Function By eV Group |
|---|---|---|
| 4 | Vanadium | 4.0–4.5 |
|   | Chromium | 4.5–5.0 |
|   | Iron | 4.0–4.5 |
|   | Cobalt | 4.0–4.5 |
|   | Nickel | ~4.5 |
|   | Copper | 4.0–4.5 |
|   | Zinc | 4.0–4.5 |
|   | Germanium | 4.5–5.0 |
|   | Arsenic | 5.0–5.5 |
|   | Selenium | 4.5–5.0 |
| 5 | Molybdenum | 4.0–4.5 |
|   | Technetium | 4.0–4.5 |
|   | Ruthenium | 4.5–5.0 |
|   | Rhodium | 4.5–5.0 |
|   | Palladium | 4.5–5.0 |
|   | Silver | 4.0–4.5 |
|   | Cadmium | 4.0–4.5 |
|   | Tin | 4.0–4.5 |
|   | Antimony | 4.0–4.5 |
|   | Tellurium | 4.5–5.0 |
| 6 | Tantalum | 4.0–4.5 |
|   | Tungsten | ~4.5 |
|   | Rhenium | ~5.0 |
|   | Osmium | 4.5–5.0 |
|   | Iridium | 5.5–6.0 |
|   | Platinum | 5.5–6.0 |
|   | Gold | 4.5–5.0 |
|   | Mercury | ~4.5 |
|   | Lead | ~4.0 |
|   | Bismuth | 4.0–4.5 |
|   | Polonium | 4.5–5.0 |

From the foregoing listing of available metals having a work function of 4 eV or greater attractive higher work function metals for the most part are accounted for aluminum, the Group Ib metals (copper, silver, and gold), the metals in Groups IV, V, and VI, and the Group VIII transition metals, particularly the noble metals from this group. Aluminum, copper, silver, gold, tin, lead, bismuth, tellurium, and antimony are particularly preferred higher work function second metals for incorporation in the cathode.

There are several reasons for not restricting the choice of the second metal based on either its work function or oxidative stability. The second metal is only a minor component of the cathode. One of its primary functions is to stabilize the first, low work function metal, and, surprisingly, it accomplishes this objective independent of its own work function and susceptibility to oxidation.

A second valuable function which the second metal performs is to reduce the sheet resistance of the cathode as a function of the thickness of the cathode. Since acceptably low sheet resistance levels (less than 100 ohms per square) can be realized at low cathode thicknesses (less than 250 Angstroms), cathodes can be formed which exhibit high levels of light transmission. This permits highly stable, thin, transparent cathodes of acceptably low resistance levels and high electron injecting efficiencies to be achieved for the first time. This in turn permits (but does not require) the organic EL devices of this invention to be constructed with light transmissive cathodes and frees the organic EL devices of any necessity of having a light transmissive anode to achieve light emission through an electrode area.

A third valuable function which the second metal has been observed to perform is to facilitate vacuum vapor deposition of a first metal onto the organic luminescent medium of the EL device. In vapor deposition less metal is deposited on the walls of the vacuum chamber and more metal is deposited on the organic luminescent medium when a second metal is also deposited. The efficacy of the second metal in stabilizing organic EL device, reducing the sheet resistance of thin cathodes, and in improving acceptance of the first metal by the organic luminescence medium is demonstrated by the examples below.

Only a very small proportion of a second metal need be present to achieve these advantages. Only about 0.1 percent of the total metal atoms of the cathode need be accounted for by the second metal to achieve a substantial improvement. Where the second metal is itself a low work function metal, both the first and second metals are low work function metals, and it is immaterial which is regarded as the first metal and which is regarded as the second metal. For example, the cathode composition can range from about 0.1 percent of the metal atoms of the cathode being accounted for by one low work function metal to about 0.1 percent of the total metal atoms being accounted for by a second low work function metal. Preferably one of the two metals account for at least 1 percent and optimally at least 2 percent of the total metal present.

When the second metal is a relatively higher (at least 4.0 eV) work function metal, the low work function metal preferably accounts for greater than 50 percent of the total metal atoms of the cathode. This is to avoid reduction in electron injection efficiency by the cathode, but it is also predicated on the observation that the benefits of adding a second metal are essentially realized when the second metal accounts for less than 20 percent of the total metal atoms of the cathode.

Although the foregoing discussion has been in terms of a binary combination of metals forming the cathode, it is, of course, appreciated that combinations of three, four, or even higher numbers of metals are possible and can be employed, if desired. The proportions of the first metal noted above can be accounted for by any convenient combination of low work function metals and the proportions of the second metal can be accounted for any combination of high and/or low work function metals.

While the second metal or metals can be relied upon to enhance electrical conductivity, their minor proportion of the total cathode metal renders it unnecessary that these metals be present in an electrically conducting form. The second metal or metals can be present as compounds (e.g., lead, tin, or antimony telluride) or in an oxidized form, such as in the form of one or more metal oxides or salts. Since the first, low work function metal or metals account for the major proportion of the cathode metal content and are relied upon for electron conduction, they are preferably employed in their elemental form, although some oxidation may occur on aging.

In depositing the first metal alone onto a substrate or onto the organic luminescent medium, whether from solution or, preferably, from the vapor phase, initial, spatially separated deposits of the first metal form nuclei for subsequent deposition. Subsequent deposition leads to the growth of these nuclei into microcrystals. The result is an uneven and random distribution of microcrystals, leading to a non-uniform cathode. By presenting a second metal during at least one of the nucleation and growth stages, and preferably, both, the high degree of symmetry which a single element affords is reduced. Since no two substances form crystal cells of exactly the same habit and size, any second metal reduces the degree of symmetry and at least to some extent acts to retard microcrystal growth. Where the first and second metals have distinctive crystal habits, spatial symmetry is further reduced and microcrystal growth is further retarded. Retarding microcrystal growth favors the formation of additional nucleation sites. In this way the number of deposition sites is increased and a more uniform coating is achieved.

Depending upon the specific choice of metals, the second metal, where more compatible with the substrate, can produce a disproportionate number of the nucleation sites, with the first metal then depositing at these nucleation sites. Such a mechanism may, if fact, account for the observation that, with a second metal present, the efficiency with which the first metal is accepted by a substrate is significantly enhanced. It has been observed, for example, that less deposition of the first metal occurs on vacuum chamber walls when a second metal is being codeposited.

The first and second metals of the cathode are intimately intermingled, being codeposited. That is, the deposition of neither the first nor second metals is completed before at least a portion of the remaining metal is deposited. Simultaneous deposition of the first and second metals is generally preferred. Alternatively, successive incremental depositions of the first and second metals can be undertaken, which at their limit may approximate concurrent deposition.

While not required, the cathode, once formed can be given post treatments. For example, the cathode may be heated within the stability limits of the substrate in a reducing atmosphere. Other action on the cathode can be undertaken as a conventionally attendant feature of leading bonding or device encapsulation.

EXAMPLES

The invention and its advantages are further illustrated by the specific examples which follow. The term "atomic percent" indicates the percentage of a particular metal present, based on the total number of metal atoms present. In other words, it is analogous to mole percent, but is based on atoms rather than molecules. The term "cell" as employed in the examples denotes an organic EL device.

EXAMPLES 1-6

Hue Modification

An EL device containing an organic luminescent medium satisfying the requirements of the invention was constructed in the following manner:

(a) A transparent anode of indium tin oxide coated glass was polished with 0.05 μm alumina abrasive for a few minutes, followed by ultrasonic cleaning in a 1:1 (volume) mixture of isopropyl alcohol and distilled water. It was rinsed with isopropyl alcohol and then immersed in toluene vapor for about 5 minutes.

(b) A hole injecting and transporting ATA-1 (750 Å) layer was then deposited on the anode. ATA-1 was evaporated from a quartz boat using a tungsten filament.

(c) An electron injecting and transporting layer (750 Å) forming the luminescent zone was then deposited on top of the ATA-1 layer. HM-1 was employed as a host material and was evaporated from a quartz boat. The fluorescent material to be incorporated in the luminescent zone as a dopant was concurrently evaporated from a separate quartz boat. In one instance no fluorescent material was incorporated. Tungsten filaments were employed for both evaporations.

(d) On top of the luminescent zone was deposited a 2000 Å cathode formed of a 10:1 atomic ratio of Mg and Ag.

The shift in hue of light emitted by the organic EL device attributable to the presence of differing fluorescent materials is summarized below in Table I. The power conversion of the organic EL device (hereinafter also referred to simply as efficiency) was measured as the ratio of the power of the light emitted to the electrical power supplied, measured at a light output level of 0.05 mW/cm$^2$. The relative efficiency was determined by dividing the efficiency of the EL device being examined by the efficiency of the corresponding EL device lacking a dopant.

TABLE I

| EL Device | Dopant | Conc. Mole % | Rel. Power Conv. Eff. | Hue |
|---|---|---|---|---|
| Control | None | 0 | 1 | Green |
| Ex. 1 | FD-27 | $3 \times 10^{-1}$ | 1.5 | Orange |
| Ex. 2 | FD-28 | $1.6 \times 10^{-1}$ | 2 | Red-orange |
| Ex. 3 | FD-29 | $0.5 \times 10^{-1}$ | 0.5 | Red-orange |
| Ex. 4 | FD-30 | $2 \times 10^{-1}$ | 0.8 | Red-orange |
| Ex. 5 | FD-31 | $6 \times 10^{-1}$ | 0.6 | Red-orange |
| Ex. 6 | FD-119 | $0.3 \times 10^{-1}$ | 0.9 | Orange-green |

From Table I it is apparent that in all instances the presence of the fluorescent dye as a dopant shifted light emission to longer wavelengths. By comparing spectra of emitted light with and without FD-28 present it was determined that the peak emission was shifted from about 540 nm to 610 nm by the addition of the fluorescent dye. The presence of FD-27 and FD-28 had the further beneficial effect of markedly increasing the power conversion efficiencies of the organic EL devices. The control EL device has an absolute efficiency of $5 \times 10^{-3}$ W/W.

EXAMPLES 7-13

Hue as a Function of Concentration

A series of organic EL devices were prepared as described in Examples 1 through 6, using FD-31 at differing concentration levels. The results are summarized in Table II.

TABLE II

| Conc. Mole % | Rel. Eff. (W/W) | Emission λmax |
|---|---|---|
| 0 | 1.0 | 535 |
| $2.2 \times 10^{-2}$ | 0.9 | 648 |
| $6.2 \times 10^{-2}$ | 0.4 | 640 |
| $1.1 \times 10^{-1}$ | 0.8 | 645 |
| $3.2 \times 10^{-1}$ | 0.35 | 666 |
| $4.5 \times 10^{-1}$ | 0.27 | 665 |
| 4.4 | 0.14 | 690 |

From Table II it is apparent that the peak wavelength of emission was shifted over the range of 155 nm. Output efficiencies declined somewhat as the level of fluorescent material was increased. However, output efficiencies measured at 690 nm were actually enhanced as compared to that of the EL devices containing the undoped HM-1.

EXAMPLE 14

Stability

An EL device containing an organic luminescent medium satisfying the requirements of the invention was constructed in the following manner:

(a) A transparent anode of indium tin oxide coated glass was polished with 0.05 μm alumina abrasive for a few minutes, followed by ultrasonic cleaning in a 1:1 (volume) mixture of isopropyl alcohol and distilled water. It was rinsed with isopropyl alcohol and then immersed in toluene vapor for about 5 minutes.

(b) A hole injecting PC-10 (300 Å) was deposited on the anode by vacuum vapor deposition. PC-10 was evaporated from a quartz boat using a tungsten filament.

(c) A hole transporting ATA-1 (350 Å) layer was then deposited on the hole injecting layer. ATA-1 was evaporated from a quartz boat using a tungsten filament.

(d) An electron injecting and transporting layer (750 Å) forming the luminescent zone was then deposited on top of the ATA-1 layer. HM-1 was employed as a host material and was evaporated from a quartz boat. FD-28 was incorporated in the luminescent zone as a dopant at a concentration of 2 mole percent, based on HM-1, by concurrently evaporation from a separate quartz boat. Tungsten filaments were employed for both evaporations.

(e) On top of the luminescent zone was deposited a 2000 Å cathode formed of a 10:1 atomic ratio of Mg and Ag.

The cell was run at a constant current of 20 mA/cm$^2$ in a dry argon atmosphere. The initial light output was 0.45 mW/cm$^2$. After continuous operation of 500 hours the light output was 0.15 mW/cm$^2$.

When a cell was constructed and operated as described above, but with FD-28 omitted, the light output of the cell dropped below 0.15 mW/cm$^2$ after only 250 hours of operation.

EXAMPLES 15-28

Reduction Potentials and Bandgaps

A series of EL devices were constructed as described in Example 14, but with differing fluorescent dyes present. The reduction potentials and bandgaps of the fluorescent dyes successfully employed and the host material HM-1 are compared in Table III.

TABLE III

| Material | E-red volts | Bandgap ev | Rel. Eff. (W/W) |
|---|---|---|---|
| HM-1 | −1.79 | 2.81 | 1.0 |
| FD-4 | −1.46 | 2.5 | 2.0 |
| FD-5 | −1.58 | 2.58 | 2.0 |
| FD-7 | −1.77 | 2.75 | 0.8 |
| FD-15 | −1.69 | 2.63 | 1.0 |
| FD-19 | −1.68 | 2.64 | — |
| FD-20 | −1.51 | 2.61 | 1.4 |
| FD-21 | −1.46 | 2.63 | 1.0 |
| FD-22 | −1.75 | 2.69 | 0.8 |
| FD-25 | −1.38 | 2.63 | — |
| FD-26 | −1.66 | 2.72 | — |
| FD-27 | −1.32 | 2.17 | 1.5 |
| FD-28 | −1.34 | 2.01 | 2.0 |
| FD-119 | −1.39 | 2 | 0.9 |

In every instance the EL device containing the fluorescent dye as a dopant to the HM-1 layer exhibited a visually detectable shift in hue. The following dyes also produced improvements in efficiency: FD-4, FD-5, FD-15, FD-20, FD-27, and FD-28.

When fluorescent dyes were substituted exhibiting either a more negative reduction potential than host material HM-1 or a larger bandgap potential, no useful result attributable to the presence of the fluorescent dye was observed.

APPENDIX I

Preparation of Fluorescent Compound FD-114 n-Butyllithium (7 mmole in 3.5 ml of hexane) was slowly added to a well-stirred, cold ($-70°$ C.) solution of diisopropylamine (1 ml, 7.2 mmole) in dry tetrahydrofuran under argon atmosphere. After stirring for five minutes, a solution of 1.5 g, 7.0 mmole of 6-methoxydihydrophenalenone in 20 ml of tetrahydrofuran was slowly added.

The resulting dark-colored solution was stirred at $-70°$ C. for 1.5 hours. The solution was then transferred using a syringe, to a round-bottomed flask containing 5 g (10 mmole) of (2-ethoxy-1,3-pentadienyl)triphenylphosphonium iodide prepared according to the procedure described by Martin et al in *J Org. Chem.* 43, pp. 4673-4676 (1978). The resulting suspension was stirred at room temperature for 1 hour and refluxed for 3 hours. All of the steps were carried out under argon and the exclusion of moisture.

The suspension was then cooled to room temperature, 50 ml of 1 normal hydrochloric acid added and stirred vigorously for 1 hour. Then 50 ml of ether were added and the layers separated. Three additional ether extractions were combined with the first and the ether solution was washed in turn with saturated sodium bicarbonate solution, water, and saturated sodium chloride solution. The ether solution was dried and the solvent evaporated to yield about 3 g of solid residue. The residue was purified via flash chromatography on silica gel using a 10:45:45 ethyl acetate, dichloromethane, cyclohexane mixture as the eluent. The desired product was seen as an orange band when illuminated with a long wavelength (355 nm) ultraviolet lamp. The bands containing the orange fluorescent dye were combined, the solvents evaporated yielding 860 mg (44% yield) of 4-methoxy-8-methyl-10-oxo-7,8,9,10-tetrahydro-benzo[d,e]anthracene having a m.p. of 135°-136° C. and m/e of 278(M+). The calculated analysis for $C_{19}H_{18}O$ was C, 82.0 H, 6.2 with the found of C, 81.7, H, 6.3.

A solution of 530 mg (1.9 mmole) of the compound identified above, in N,N-dimethylformamide (15 ml), was slowly added to a solution of 700 mg (4.1 mmole) of cupric chloride hydrate and 200 mg (4.7 mmole) of lithium chloride in N,N-dimethylformamide (30 ml) heated to 90° C. The resulting mixture was stirred for 70 minutes. Ice was added to the mixture and the resulting brown solid was separated and washed several times with cold water, yielding 397 mg (80% yield) of Dye 1. This product was shown to be pure by thin layer chromatography on silica gel, but was recrystallized from ethyl acetate-ethanol to give a material with a m.p. of 289°-295° C., and m/e of 260(M+). The structure of the dye was confirmed by the analysis of its N-phenyl-N-methylcarbamate derivative. The calculated analysis for $C_{26}H_{19}NO_3$ was C, 79.4, H, 4.9, N, 3.6 and found was C, 79.2, H, 5.1, N, 3.8.

Preparation of Fluorescent Dye FD-116

Cupric chloride dihydrate (2.45 g, 14.4 mmole) and lithium chloride (1.0 g, 22.7 mmole) were suspended in 20 ml of N,N-dimethylformamide (DMF) heated to 90° C. To this hot mixture was added a solution of 650 mg, (2.34 mmole) of the methoxy ketone intermediate of Example 1 dissolved in 10 ml of DMF. The mixture was kept at 90° C. for 24 hours and then quenched by adding ice and water. The resulting precipitate was washed several times with water and dried. It was purified by triturating with 10% methanol in 1:1 ethyl acetate/dichloromethane, yielding 300 mg (44%) of Dye 3. The product from the trituration step is pure enough for the intended applications. It can be further purified by flash chromatography on silica gel using 20% ethyl acetate in a 1:1 dichloromethane/cyclohexane mixture as eluent, yielding material with m.p. of 238°-240° C. The structure of Dye 3 was confirmed by the elemental analysis of both its methyl ether and its N-phenyl-N-methylcarbamate derivatives.

Analysis for methyl ether derivative $C_{19}H_{13}ClO_2$: Calcd: C, 73.9, H, 4.2. Found: C, 74.0, H, 4.1.

Analysis for carbamate derivative $C_{26}H_{18}ClNO_3$: Calcd: C, 73.0, H, 4.2, N, 3.3. Found: C, 72.8, H, 4.1, N, 3.1.

Preparation of Fluorescent Dye FD-118

N-phenyl-N-methylcarbamoyl chloride (1.2 equivalents) was added to a mixture of 1.2 equivalents each of pyridine and Dye 3 of Example 2 in toluene as solvent and the mixture heated to reflux for 12 hours. The toluene solution was cooled, washed with dilute hydrochloric acid, then water, and finally brine. The organic phase was separated and the solvent evaporated. The residue was purified by flash chromatography on silica gel using 20% ethyl acetate in 1:1 dichloromethane/cyclohexane as the eluent. Dye 5 has m.p. of 233°-235° C. and the elemental analysis given for the carbamate in Example 2.

Preparation of Fluorescent Dye FD-119

The methoxy ketone intermediate of Example 1 (400 mg, 1.4 mmole) dissolved in a small amount of dichloromethane was added to 5 ml, 59.8 mmole of pyrrolidine in 100 ml of anhydrous methanol and the mixture refluxed for four days with stirring. The mixture was cooled and the solvents evaporated under reduced pressure. The residue was purified by flash chromatography on silica gel using 1:1 dichloromethane/cyclohexane containing ethyl acetate ranging from 0% at the start to 50% at the end of the reaction. The appropriate fractions were combined and the solvents evaporated. The residue was triturated with ethyl acetate and filtered, giving Dye 6 in 44% yield, with m.p. of 244°-246° C., m/e 313 of (M+).

The invention has been described in detail with particular reference to preferred embodiments thereof, but it will be understood that variations and modifications can be effected within the spirit and scope of the invention.

What is claimed is:

1. An organic electroluminescent device comprising in sequence, an anode, an organic hole injecting and transporting zone, a luminescent zone, and a cathode, characterized in that
    said luminescent zone is formed of a thin film of less than 1 μm in thickness comprised of an organic host material forming a layer capable of sustaining both hole and electron injection and
located in said layer as a fluorescent material a dye capable of emitting light in response to hole-electron recombination, said dye having a bandgap no greater than that of said host material and a reduction potential less negative than that of said host material.

2. An organic electroluminescent device according to claim 1 in which said fluorescent material is chosen to provide favored sites for light emission.

3. An organic electroluminescent device according to claim 1 in which said cathode is comprised of a metal other than an alkali metal having a work function of less than 4 eV.

4. An organic electroluminescent device according to claim 1 in which said organic hole injecting and transporting zone is comprised of
 a layer in contact with said anode containing a hole injecting porphyrinic compound and
 a layer containing a hole transporting aromatic tertiary amine interposed between said hole injecting layer and said luminescent zone.

5. An organic electroluminescent device according to claim 1 in which said dye is chosen from the class consisting of coumarin, dicyanomethylenepyrans and thiopyrans, polymethine, oxabenzanthracene, xanthene, pyrylium and thiapyrylium, carbostyril, and perylene fluorescent dyes.

6. An organic electroluminescent device according to claim 5 in which said fluorescent dye is a coumarin dye of the formula:

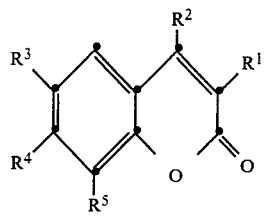

where
$R^1$ is chosen from the group consisting of hydrogen, carboxy, alkanoyl, alkoxycarbonyl, cyano, aryl, and a heterocylic aromatic group,
$R^2$ is chosen from the group consisting of hydrogen, alkyl, haloalkyl, carboxy, alkanoyl, and alkoxycarbonyl,
$R^3$ is chosen from the group consisting of hydrogen and alkyl,
$R^4$ is an amino group, and
$R^5$ is hydrogen, or
$R^1$ and $R^2$ together form a fused carbocyclic ring, or the amino group forming $R^5$ independently completes with at least one of $R^4$ and $R^6$ a fused ring.

7. An organic electroluminescent device according to claim 5 in which said fluorescent dye is a dye of the formula:

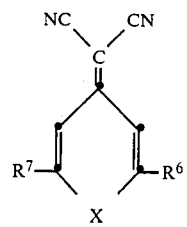

where
X represents oxygen or sulfur;
$R^6$ represents a 2-(4-aminostyryl) group; and
$R^7$ represents a second $R^6$ group, an alkyl group, or a phenyl group.

8. An organic electroluminescent device according to claim 1 in which said cathode is comprised of a metal other than an alkali metal having a work function of less than 4 eV and is light transmissive.

9. An organic electroluminescent device according to claim 8 in which said cathode is formed of a combination of metals other than alkali metals having a work function of less than 4 eV.

10. An organic electroluminescent device according to claim 8 in which said cathode additionally includes less than 50 atomic percent of a second metal having a work function of greater than 4 eV.

11. An organic electroluminescent device according to claim 1 in which said fluorescent material is present in a concentration of from $10^{-3}$ to 10 mole percent, based on the moles of host material.

12. An organic electroluminescent device comprising in sequence, an anode, an organic luminescent medium, and a cathode,
 characterized in that
  said organic luminescent medium is less than 5000 Angstroms in thickness and is comprised of
  an electron injecting and transporting layer containing
   an organic host material capable of sustaining both hole and electron injection and
   located in said layer as a fluorescent material a dye chosen to provide favored sites for light emission having a bandgap no greater than that of said host material and a reduction potential less negative than that of said host material.

13. An organic electroluminescent device according to claim 12 in which said host material is capable of emitting light of a first wavelength in the absence of said fluorescent material and said fluorescent material is capable of absorbing light at the first wavelength.

14. An organic electroluminescent device according to claim 13 in which the wavelength of maximum light emitted by said host material in the absence of said fluorescent material is within 25 nm of the wavelength of maximum light absorption by said fluorescent material.

15. An organic electroluminescent device according to claim 12 in which said organic hole injecting and transporting zone is comprised of
 a layer in contact with said anode containing a hole injecting porphyrinic compound and
 a layer containing a hole transporting aromatic tertiary amine interposed between said hole injecting layer and said luminescence zone.

16. An organic electroluminescent device according to claim 12 in which said host material is a chelated oxinoid compound.

17. An organic electroluminescent device according to claim 16 in which said chelated oxinoid compound is represented by the structure:

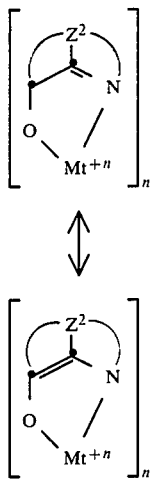

wherein

Mt represents a metal;

n is an integer of from 1 to 3; and $Z^2$ independently in each occurrence represents the atoms completing a nucleus having at least two fused aromatic rings.

18. An organic electroluminescent device comprising in sequence an anode formed of one or more metals having a work function of greater than 4 eV, a cathode formed of a combination of metals, with one or more metals other than alkali metals having a work function of less than 4 eV accounting for greater than 50 percent on an atomic basis of the total cathode metals, and, interposed between said anode and cathode, an organic luminescent medium consisting of an organic hole injecting zone and a luminescent zone, said organic luminescent medium being less than 5000 Angstroms in thickness and comprised of an electron injecting and transporting layer containing an organic host material capable of sustaining both hole and electron injection and located in said layer as an optically coupled fluorescent material chosen to provide favored sites for light emission a dye having a bandgap no greater than that of said host material and a reduction potential less negative than that of said host material and a hole injecting and transporting zone comprised of a tetraphenyldiamine layer contacting said electron injecting and transporting zone, a hole injecting porphyrinic compound containing layer contacting said anode, and a triphenylamine layer interposed between said tetraphenyldiamine layer and porphyrinic compound.

19. An organic electroluminescent device comprising in sequence an anode, a cathode containing magnesium and a minor amount of another metal chosen from the class consisting of aluminum, copper, silver, gold, tin, lead, bismuth, tellurium, indium, and antimony, at least one of said anode and said cathode being light transmissive, and, interposed between said anode and said cathode, an organic luminescent medium consisting of an organic hole injecting zone and a luminescent zone, said organic luminescent medium being less than 5000 Angstroms in thickness and comprised of a hole injecting layer containing a phthalocyanine in contact with said anode, a first hole transporting layer containing a bis-triphenylamine, a second hole transporting layer containing a tetraphenyldiamine, and a luminescent zone containing a metal chelated 8-hydroxyquinoline host material and a fluorescent dye capable of absorbing light at the emission wavelength of said metal chelated 8-hydroxyquinoline, having a lower bandgap and a less negative reduction potential than said chelated 8-hydroxyquinoline.

* * * * *

UNITED STATES PATENT AND TRADEMARK OFFICE
CERTIFICATE OF CORRECTION

PATENT NO. : 4,769,292
DATED      : Sept. 6, 1988
INVENTOR(S) : Ching W. Tang, et al It is certified that error appears in the above-indentified patent and that said Letters Patent is hereby corrected as shown below:

Col. 8, line 60, "Bis(2-methyl-8-quinolinolato)aluminum oxide" should read --Tetrakis(2-methyl-8-quinolinolato-mu-oxo-dialuminum--.

Signed and Sealed this

First Day of February, 1994

Attest:

BRUCE LEHMAN

Attesting Officer

Commissioner of Patents and Trademarks